US012085913B2

(12) United States Patent
Hauptmann et al.

(10) Patent No.: US 12,085,913 B2
(45) Date of Patent: Sep. 10, 2024

(54) METHOD FOR GENERATING A CONTROL SCHEME AND DEVICE MANUFACTURING METHOD

(71) Applicant: ASML NETHERLANDS B.V., Veldhoven (NL)

(72) Inventors: Marc Hauptmann, Turnhout (BE); Amir Bin Ismail, Eindhoven (NL); Rizvi Rahman, Eindhoven (NL); Jiapeng Li, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 401 days.

(21) Appl. No.: 17/601,307

(22) PCT Filed: Mar. 19, 2020

(86) PCT No.: PCT/EP2020/057687
§ 371 (c)(1),
(2) Date: Oct. 4, 2021

(87) PCT Pub. No.: WO2020/212068
PCT Pub. Date: Oct. 22, 2020

(65) Prior Publication Data
US 2022/0187786 A1    Jun. 16, 2022

(30) Foreign Application Priority Data

Apr. 17, 2019  (EP) .................................... 19169933
Apr. 29, 2019  (EP) .................................... 19171535
Nov. 18, 2019  (EP) .................................... 19209638

(51) Int. Cl.
G05B 19/404    (2006.01)
G03F 7/00      (2006.01)
G03F 7/20      (2006.01)

(52) U.S. Cl.
CPC ....... *G05B 19/404* (2013.01); *G03F 7/70516* (2013.01); *G05B 2219/45031* (2013.01); *G05B 2219/50296* (2013.01)

(58) Field of Classification Search
CPC ............ G05B 19/404; G05B 19/41875; G05B 19/418; G05B 2219/45031;
(Continued)

(56) References Cited

U.S. PATENT DOCUMENTS 5,774,575 A     6/1998  Tanaka et al.
9,140,997 B2 *  9/2015  Harayama ........... G03F 7/70616
(Continued)

FOREIGN PATENT DOCUMENTS

CN    101059658    10/2007
JP    2005-354088  12/2005
WO    2018228750   12/2018

OTHER PUBLICATIONS

International Search Report and Written Opinion issued in corresponding PCT Patent Application No. PCT/EP2020/057687, dated Jul. 16, 2020.
Crow, D. et al.: "Enhancement of Photolithographic Performance by Implementing an Advanced Process Control System", Proc. of SPIE, vol. 5378 (2004).
Communication issued in corresponding Chinese Patent Application No. 202080029676.7, dated Jan. 23, 2024.

*Primary Examiner* — Nikolay K Yushin
(74) *Attorney, Agent, or Firm* — Pillsbury Winthrop Shaw Pittman, LLP

(57) ABSTRACT

A method for generating a sampling scheme for a device manufacturing process, the method including: obtaining a measurement data time series of a plurality of processed substrates; transforming the measurement data time series to obtain frequency domain data; determining, using the frequency domain data, a temporal sampling scheme; determining an error offset introduced by the temporal sampling scheme on the basis of measurements on substrates performed according to the temporal sampling scheme; and (Continued)

determining an improved temporal sampling scheme to compensate the error offset.

20 Claims, 33 Drawing Sheets

(58) Field of Classification Search
CPC ........... G05B 2219/50296; G05B 2219/37224; G03F 7/70516; G03F 7/00; G03F 7/70525; G03F 7/70633; Y02P 90/02; Y02P 90/30; Y02P 90/80
See application file for complete search history.

(56) References Cited

U.S. PATENT DOCUMENTS

| | | |
|---|---|---|
| 2005/0267609 A1 | 12/2005 | Van Donkelaar et al. |
| 2007/0250187 A1 | 10/2007 | Heertjes |
| 2012/0008127 A1 | 1/2012 | Tel et al. .......................... 355/77 |
| 2013/0265558 A1* | 10/2013 | Harayama ........... G03F 7/70591 355/52 |

* cited by examiner

Fig. 3
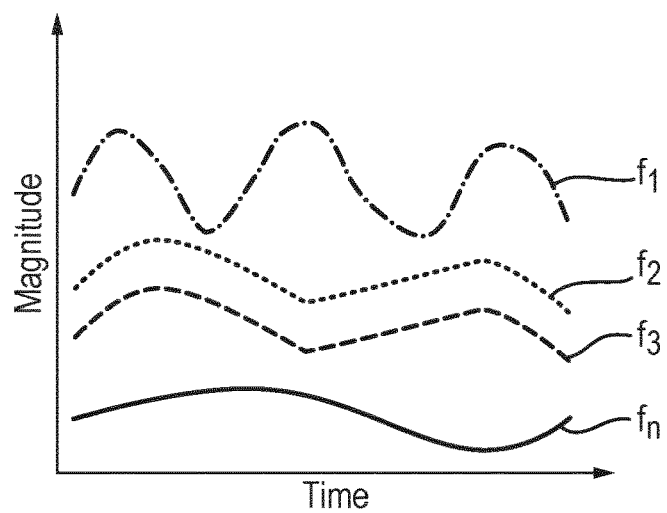
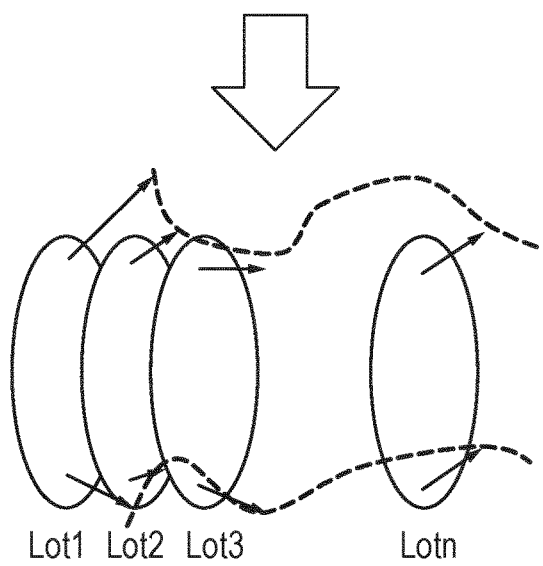
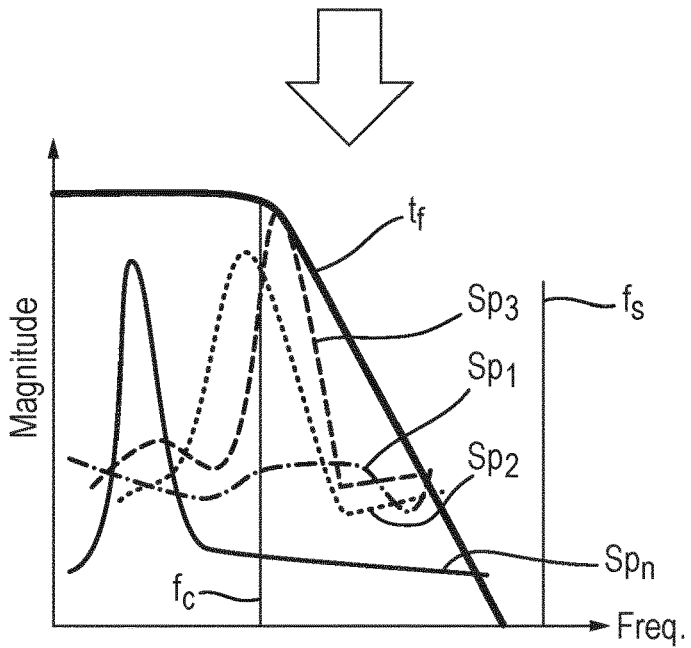

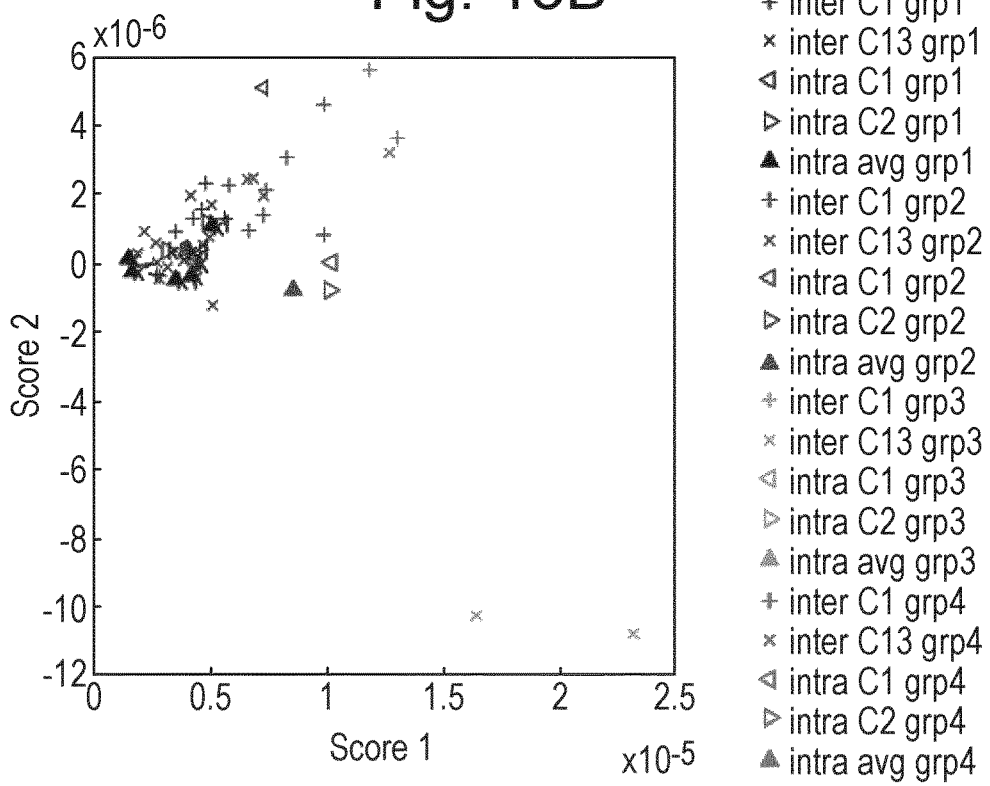
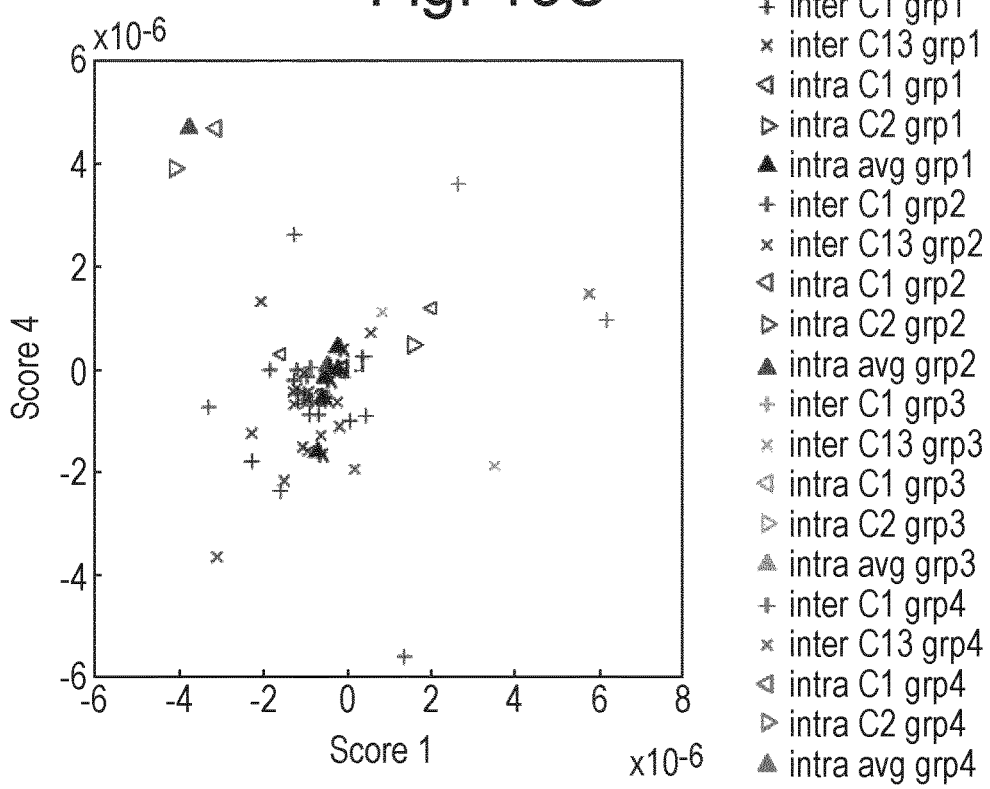

Fig. 18
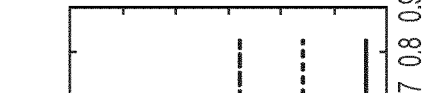
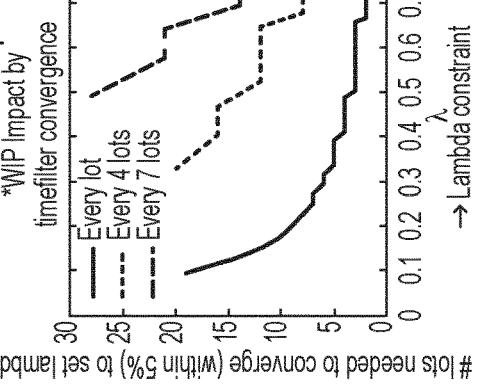

Fig. 21
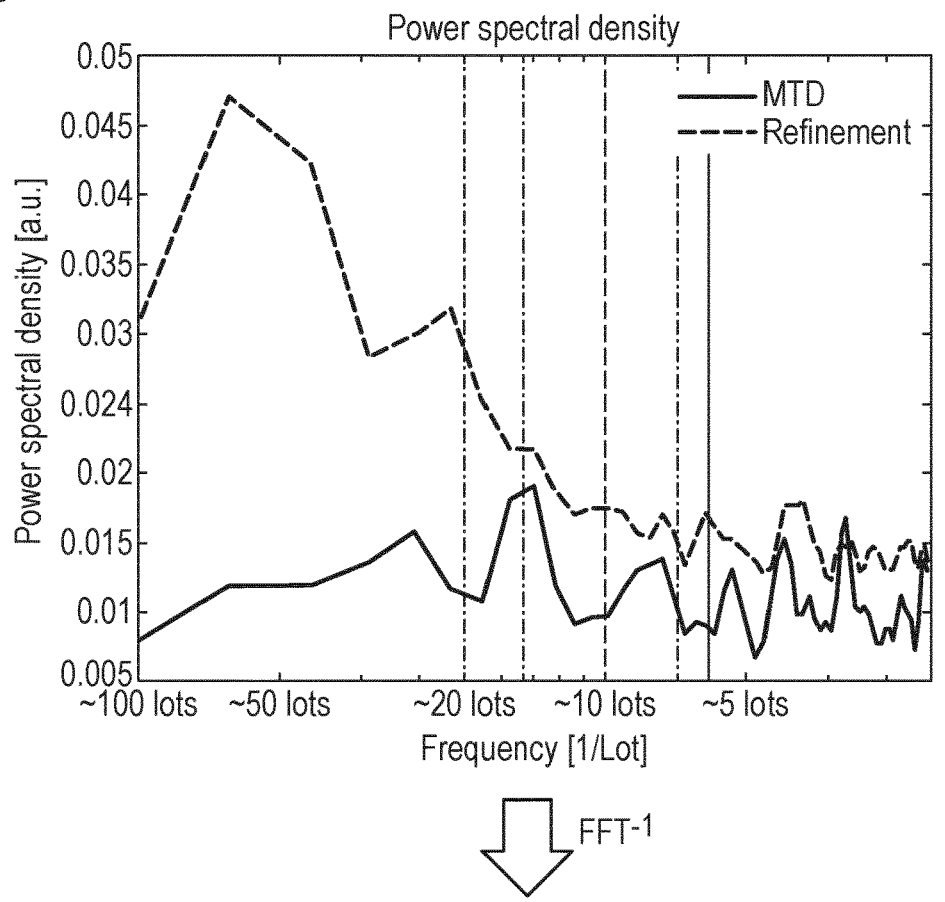
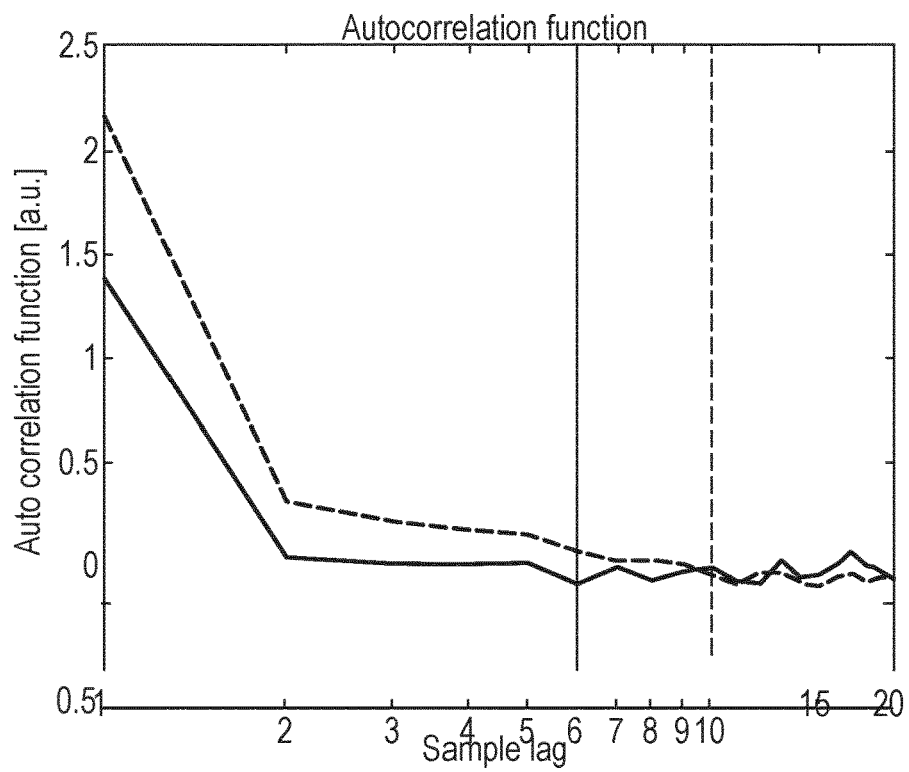

Fig. 22
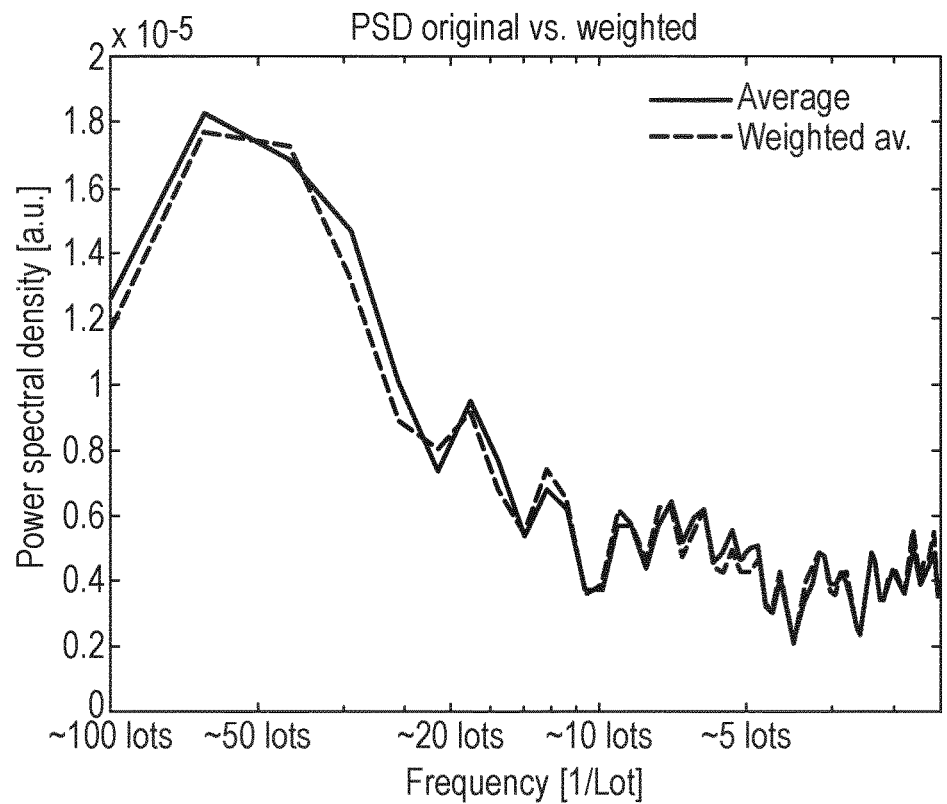
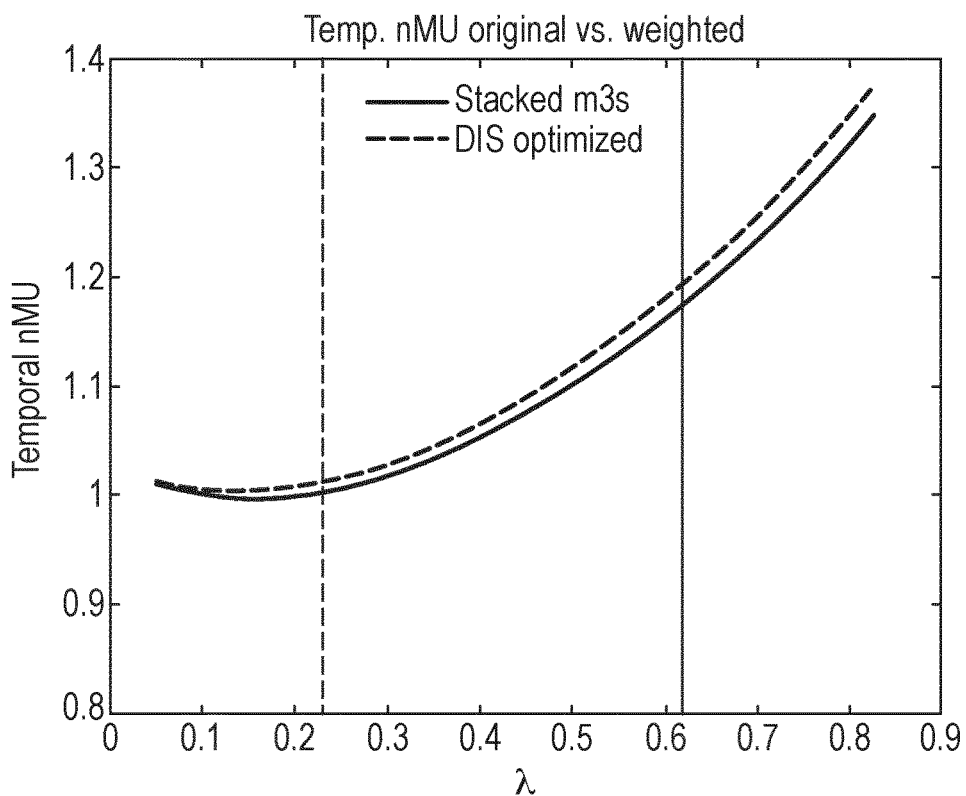

Fig. 23
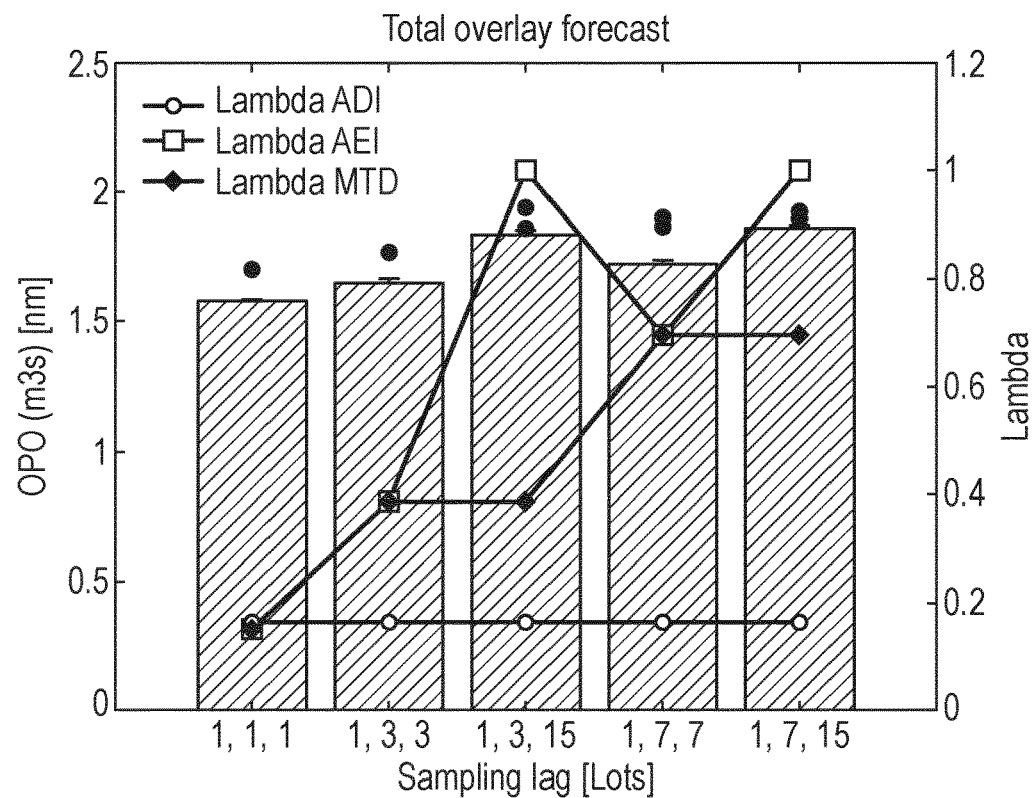
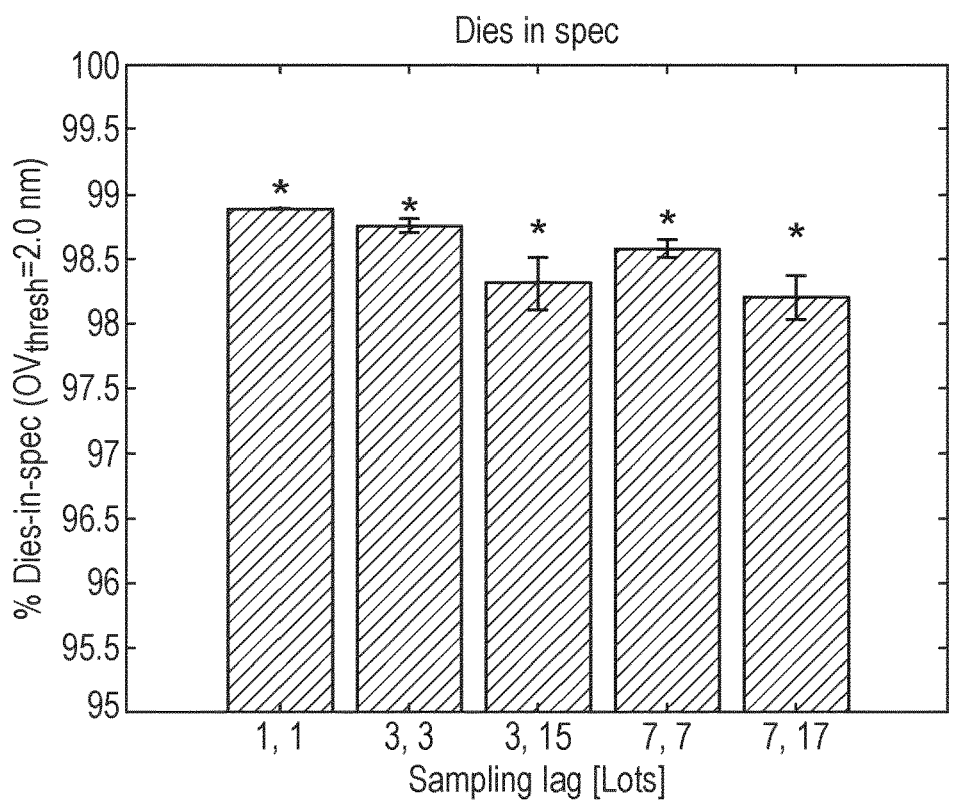

Fig. 27
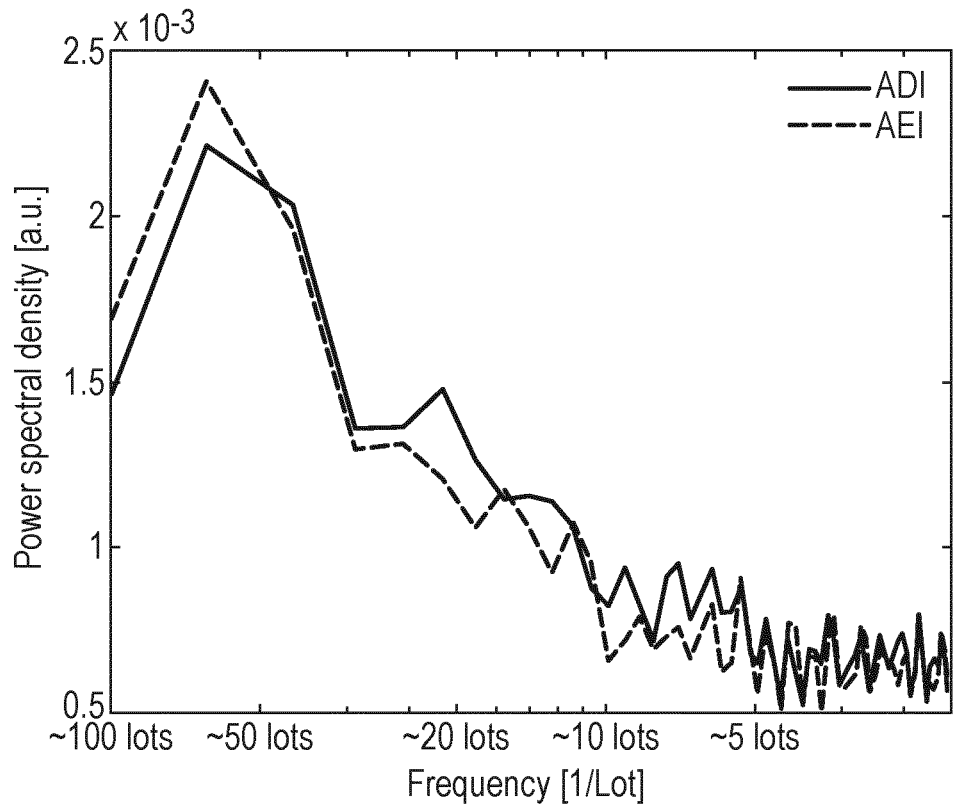
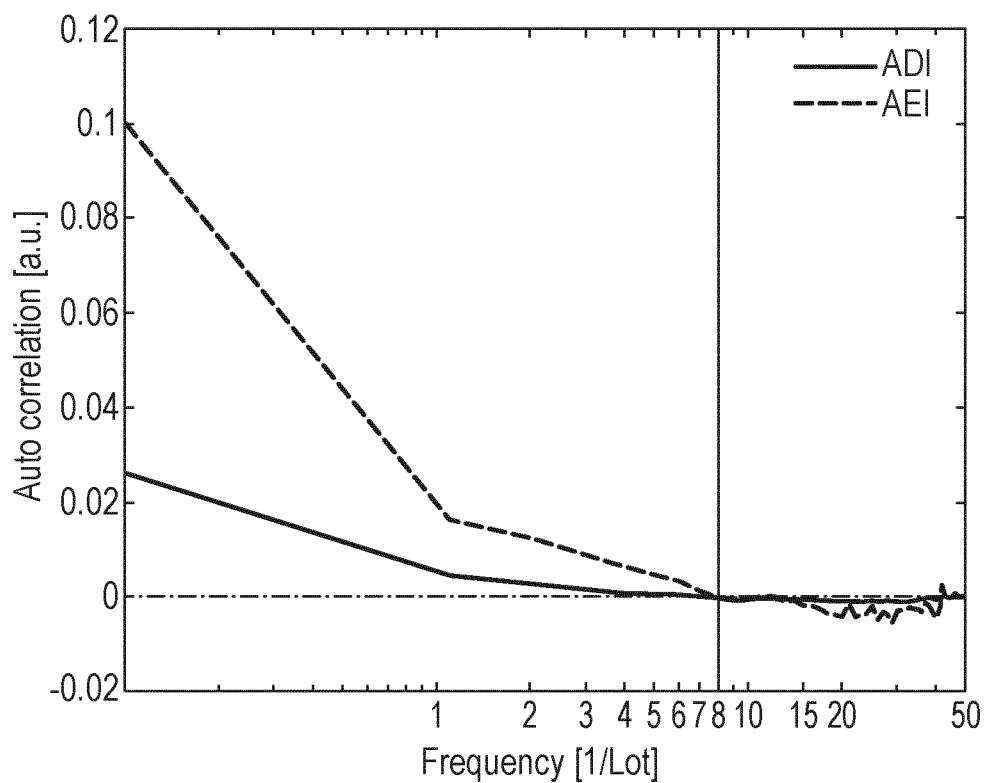

Fig. 28
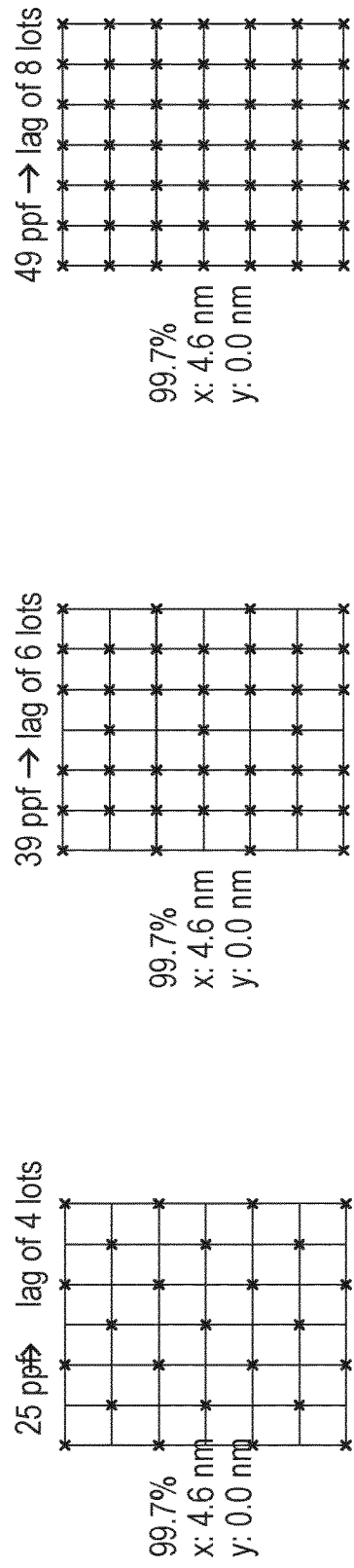
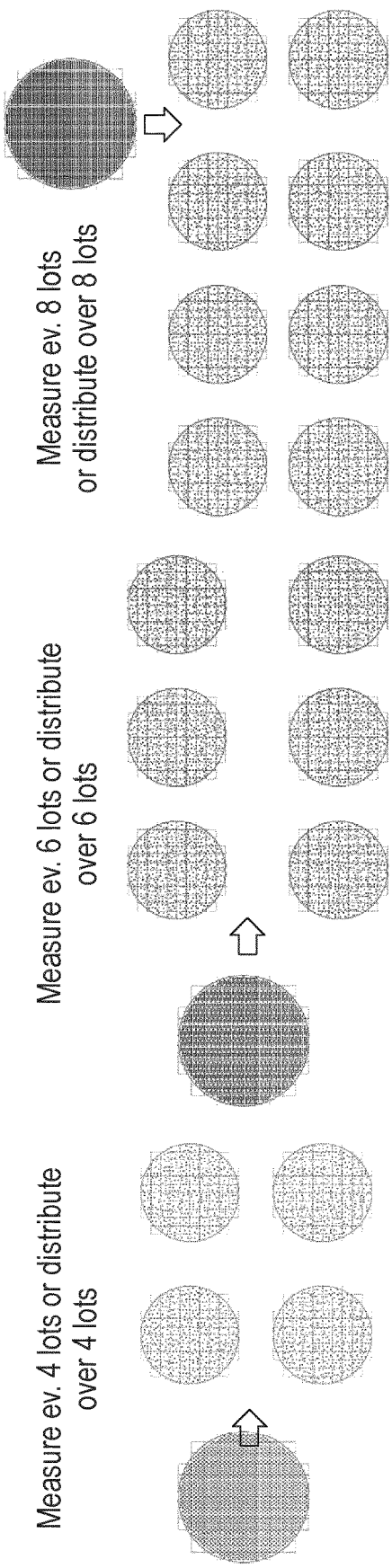

METHOD FOR GENERATING A CONTROL SCHEME AND DEVICE MANUFACTURING METHOD

CROSS-REFERENCE TO RELATED APPLICATIONS

This application is the U.S. national phase entry of PCT Patent Application No. PCT/EP2020/057687 which was filed Mar. 19, 2020, which claims the benefit of priority of European Patent Application No. 19169933.9 which was filed on Apr. 17, 2019, of European Patent Application No. 19171535.8 which was filed on Apr. 29, 2019, and of European Patent Application No. 19209638.6 which was filed on Nov. 18, 2019 which are incorporated herein in their entireties its entirety by reference.

BACKGROUND

Field of the Invention

The present invention relates to generating control schemes and device manufacturing using the control schemes.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. The patterned radiation-sensitive layer is then developed and a process apparatus, such as an etcher, is used to fix the pattern in the substrate.

To create an electronic device, it is necessary to repeat the exposure and fixing steps many times, e.g. up to 30, to create the different layers of a device. Each layer is applied to a batch, also known as a lot, of substrates at a time. To improve yield, i.e. the fraction of devices that are functional, it is known to use measurements performed on substrates to adjust the exposures of subsequent substrates in the same batch or later batches to which the same process is applied, for example to reduce errors in overlay, focus or CD. This process is known as Automated Process Control. Where measurements of multiple substrates are available, a weighted moving average of the measurements is often used as the input to the process control.

Whilst APC improves yield, the measurements (often referred to a metrology) that provide the necessary input to the control loop are time consuming Therefore, it is necessary to compromise between throughput and yield or to provide additional metrology tools, which are expensive. Determining an optimum metrology and control strategy is difficult, and often has to be done by trial and error. Improvements in the effectiveness of the control loop are also desirable.

SUMMARY OF THE INVENTION

The present invention aims to provide improved automated process control methods for use in lithographic manufacturing processes.

The invention in a first aspect provides a method for generating a control scheme for a device manufacturing process, the method comprising: obtaining a measurement data time series of a plurality of substrates on which an exposure step and optionally a process step have been performed; transforming the measurement data time series to obtain frequency domain data; and determining, using the frequency domain data, a control scheme to be performed on subsequent substrates.

The invention in a second aspect provides a device manufacturing process comprising: exposing an initial set of substrates using a lithographic apparatus; optionally performing a process step on the initial set of substrates; measuring a parameter of a plurality of the initial set of substrates to obtain a measurement data time series; transforming the measurement data time series to obtain frequency domain data; determining, using the frequency domain data, a control scheme to be performed on subsequent substrates; and exposing subsequent substrates using the control scheme.

The invention in a third aspects provides a method for generating a sampling scheme for a device manufacturing process, the method comprising: obtaining a measurement data time series of a plurality of processed substrates; transforming the measurement data time series to obtain frequency domain data; determining, using the frequency domain data, a temporal sampling scheme; determining an error offset introduced by the temporal sampling scheme on the basis of measurements on substrates performed according to the temporal sampling scheme; and determining an improved temporal sampling scheme to compensate said error offset.

BRIEF DESCRIPTION OF THE DRAWINGS/FIGURES

Embodiments of the invention will now be described, by way of example, with reference to the accompanying drawings in which:

FIG. 3 depicts a principle of operation of an automated process control method according to an embodiment of the invention;

Figure 15:
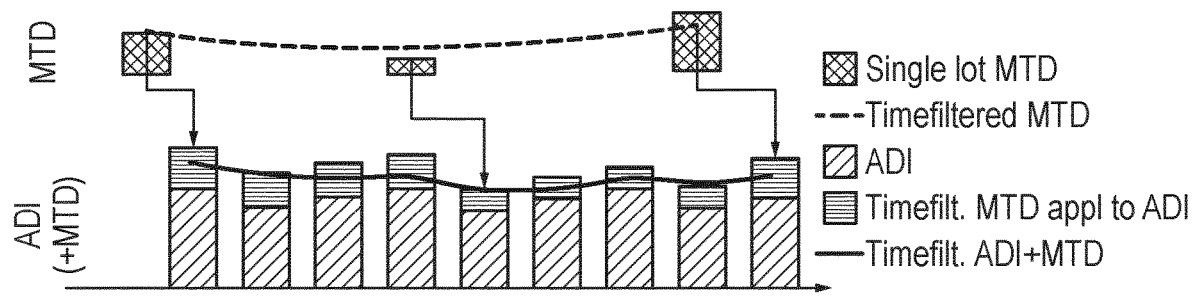
Figure 16:
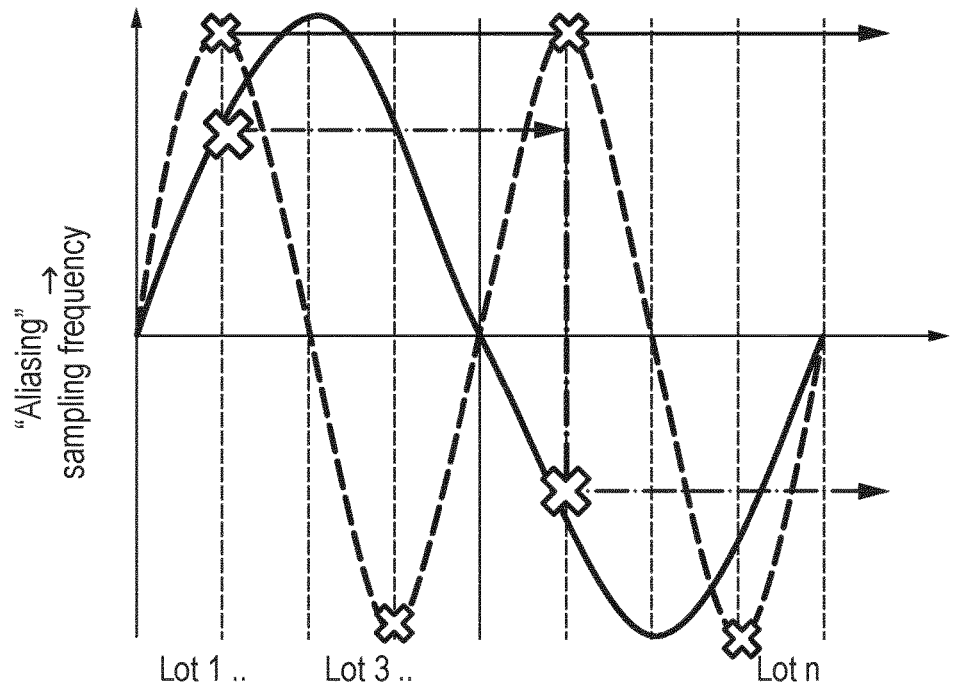
Figure 17:
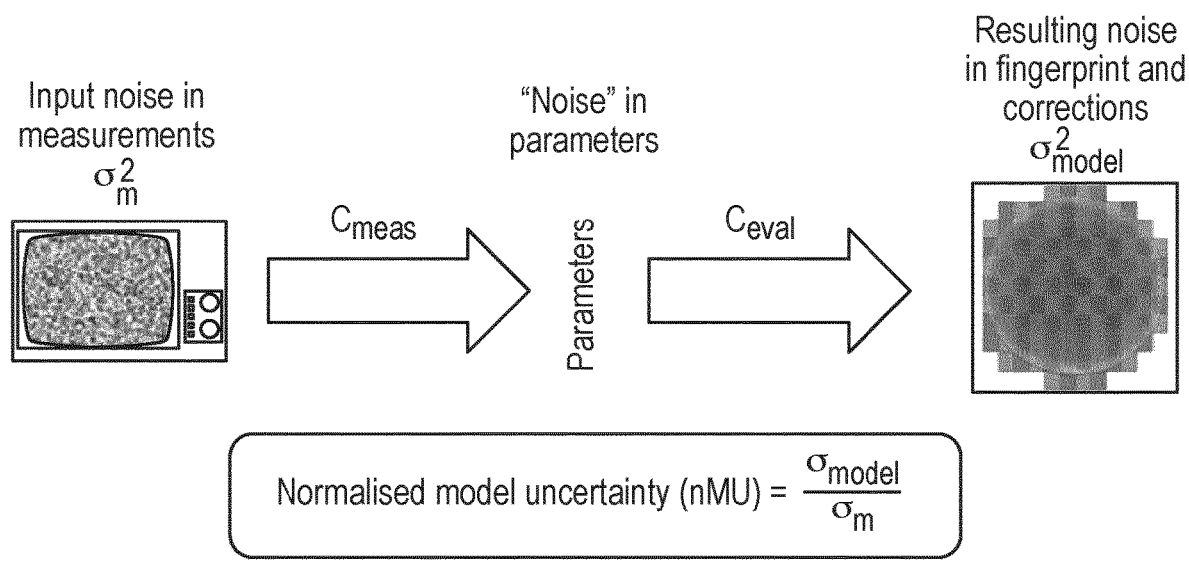
Figure 19:
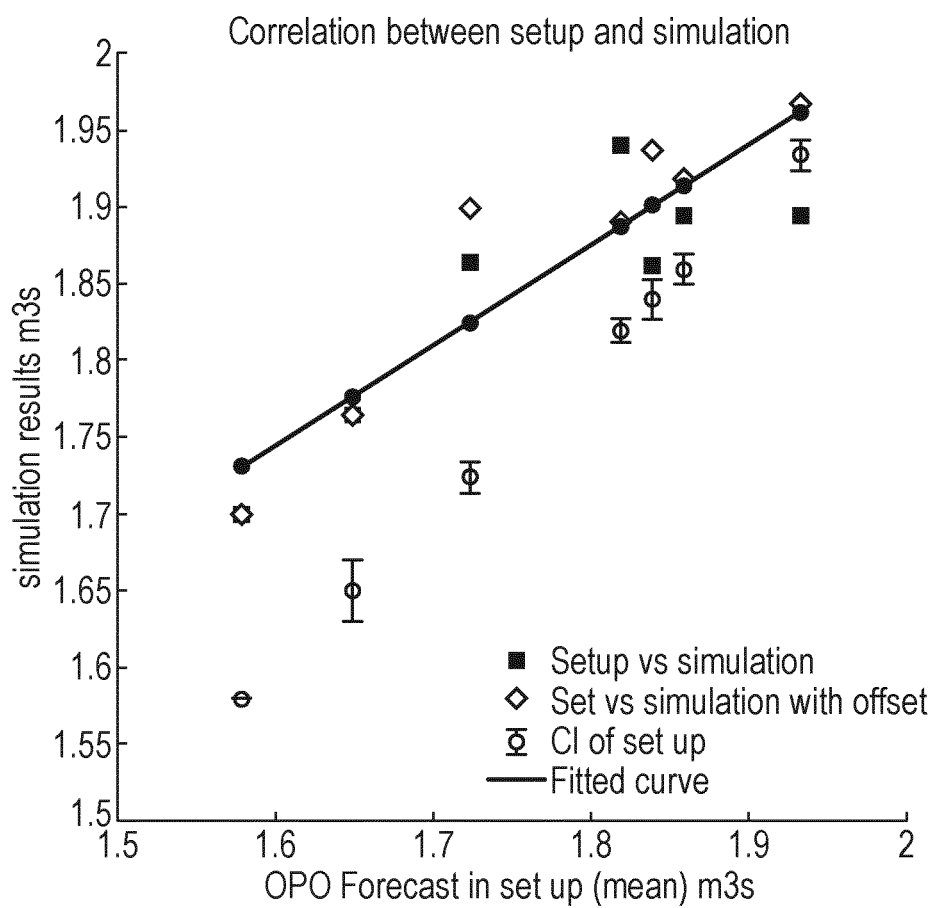
Figure 20:
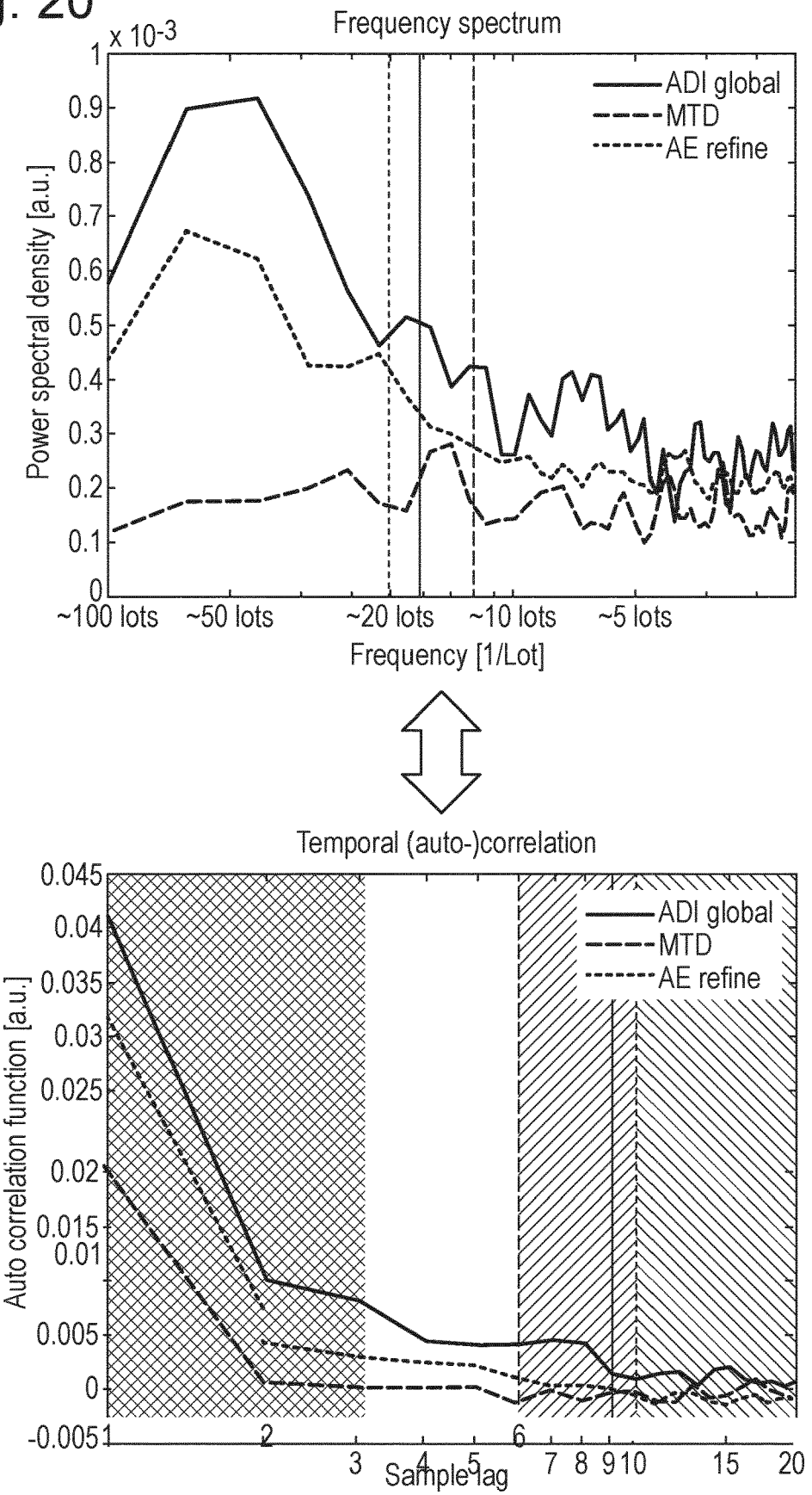
Figure 24:
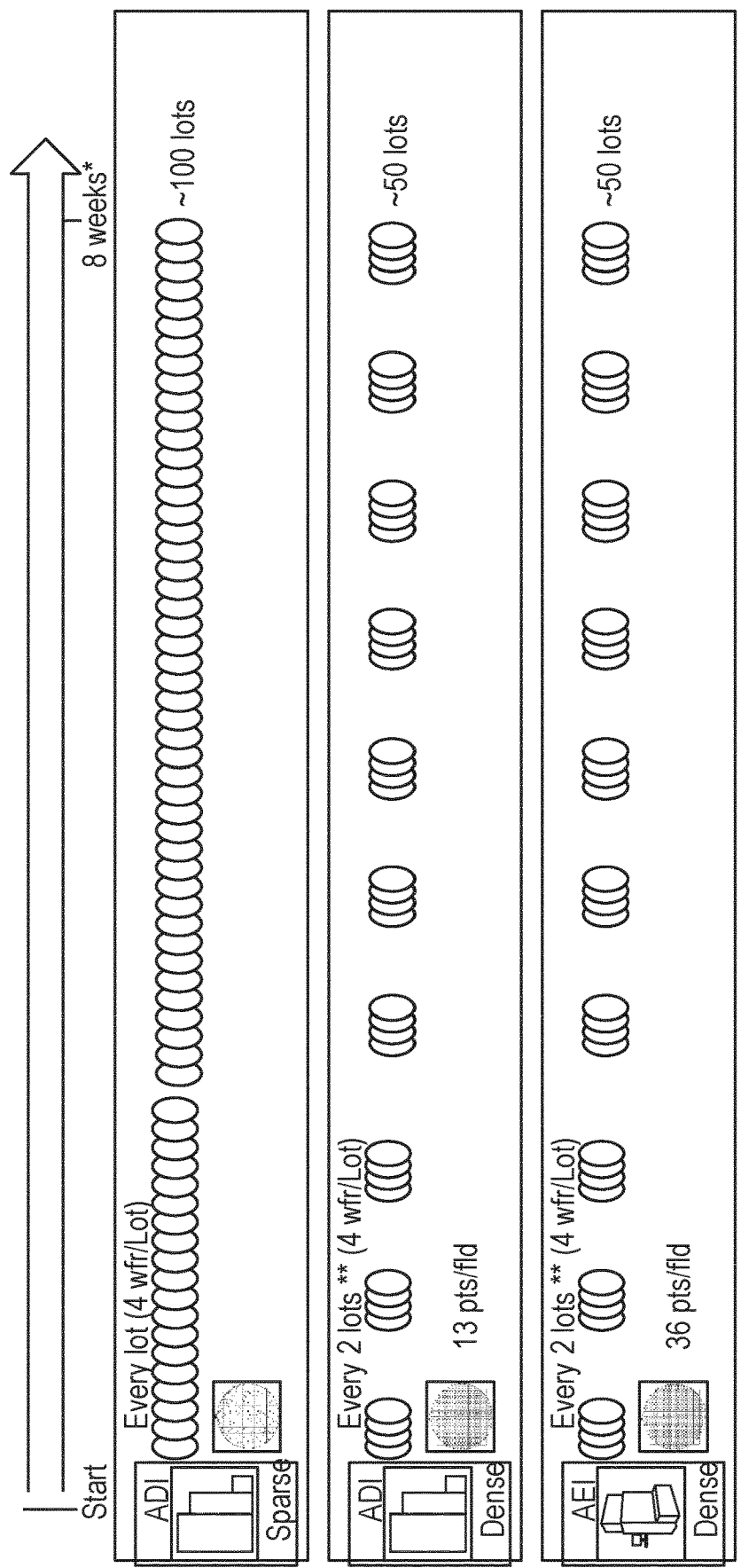

FIGS. 13A to G depict temporal grouping of parameters according to similarities in their frequency spectrum, the corresponding average frequency spectra for each parameter group and the contribution of each parameter to the average fingerprint;

FIGS. 14A to D depict reconstruction of the lot-to-lot (stacked) fingerprints for each parameter group (split into chuck1&2 wafer and average field fingerprints), as well as the corresponding frequency spectra and transfer functions of the optimized time filters per group;

FIG. 15 depicts a process using cascaded time-filtering;

FIG. 16 aliasing with different filtering strategies;

FIG. 17 depicts the impact of noise and normalized model uncertainty;

FIG. 18 depicts how a total overlay KPI is built up from different contributors;

FIG. 19 depicts correlation between setup and simulation;

FIG. 20 depicts the relationship between power spectral density and temporal autocorrelation function in an example;

FIG. 21 depicts the relationship between power spectral density and temporal autocorrelation function in another example;

FIG. 22 depicts the relationship between power spectral density and temporal normalized model uncertainty in an example;

FIG. 23 depicts a forecast of an overlay and dies in spec metric in an example;

FIG. 24 depicts a sampling scheme used to collect data under realistic conditions for the temporal setup described in the invention.

Figure 25:
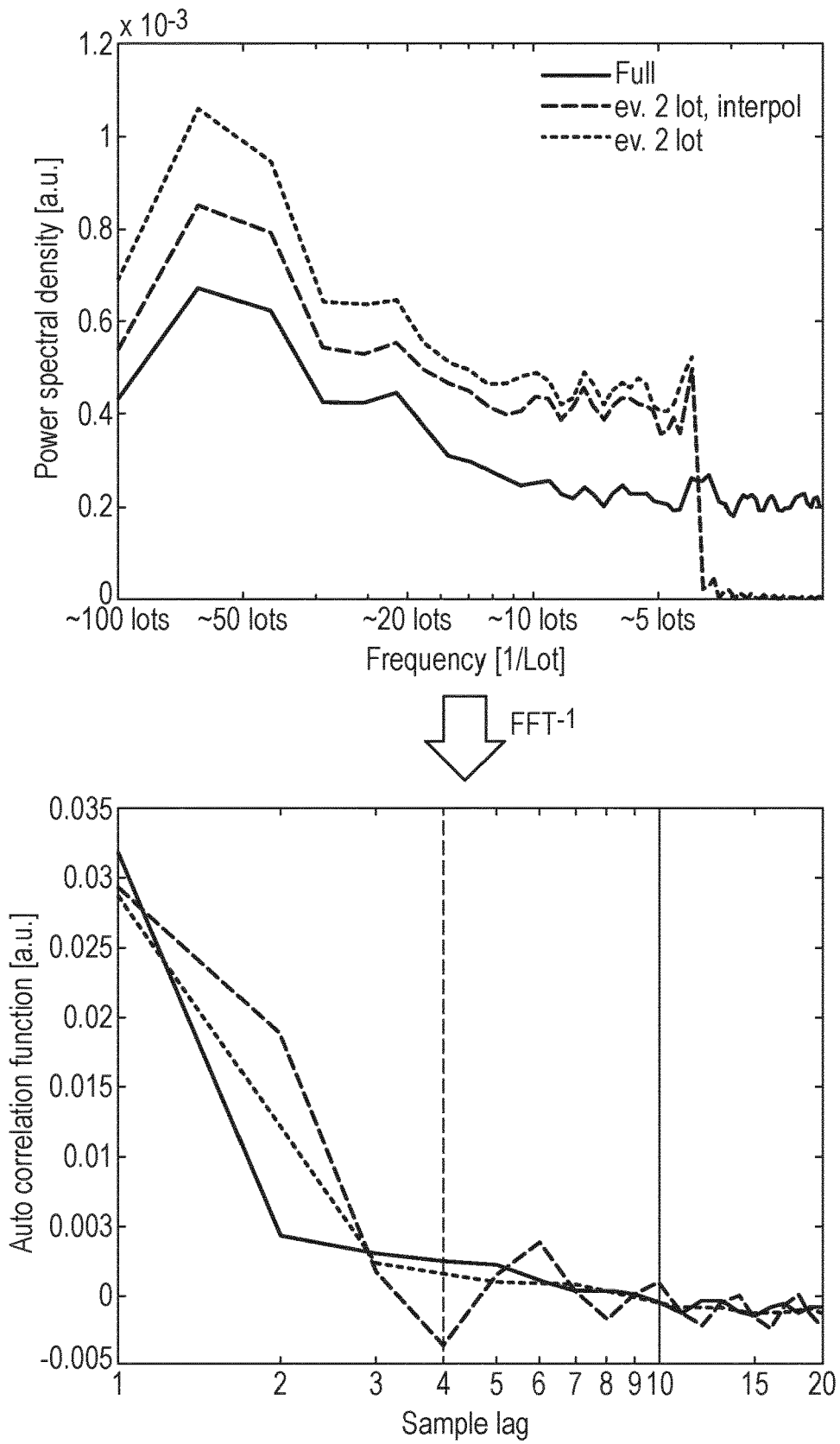
Figure 26:
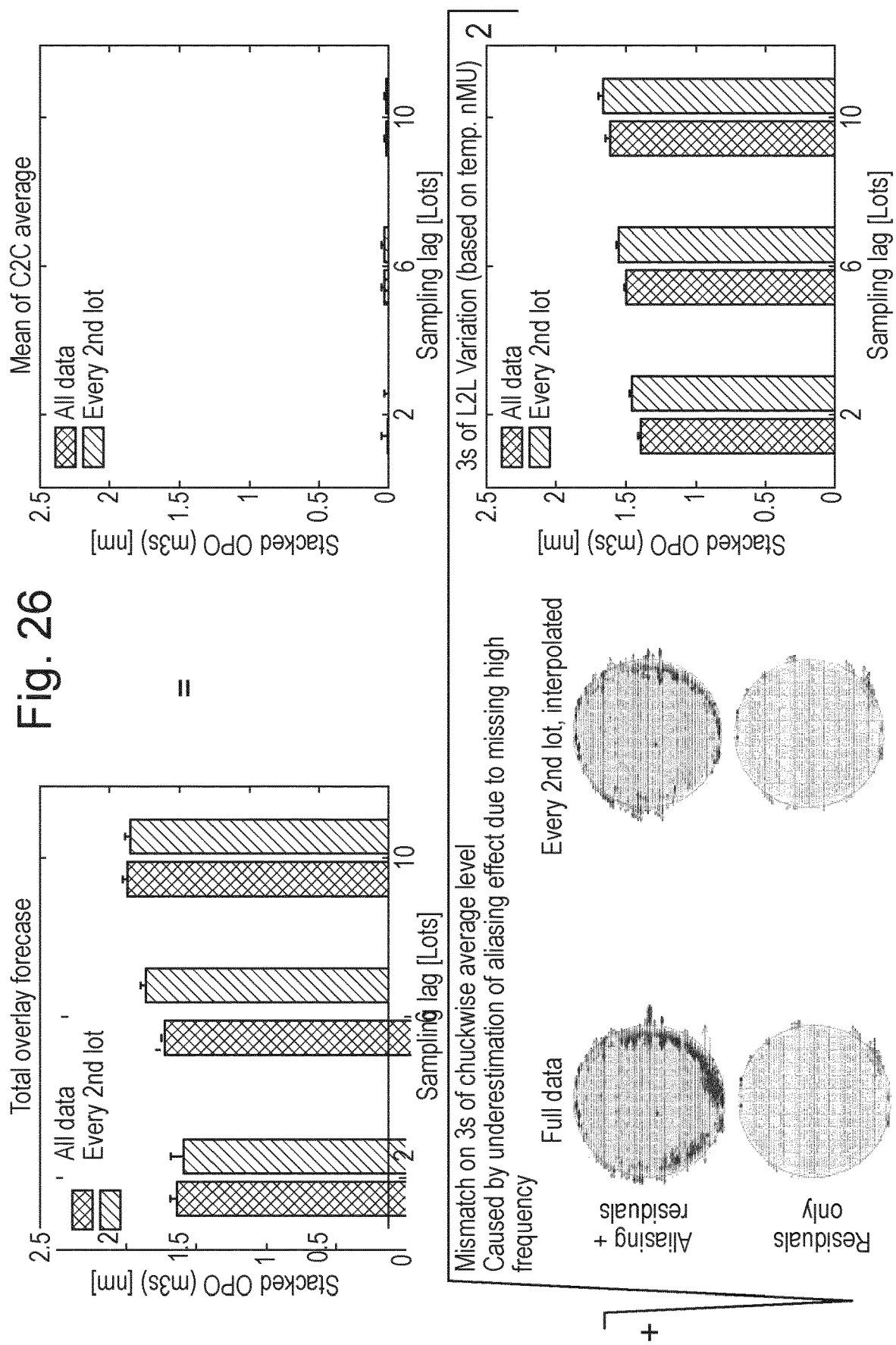
Figure 29:
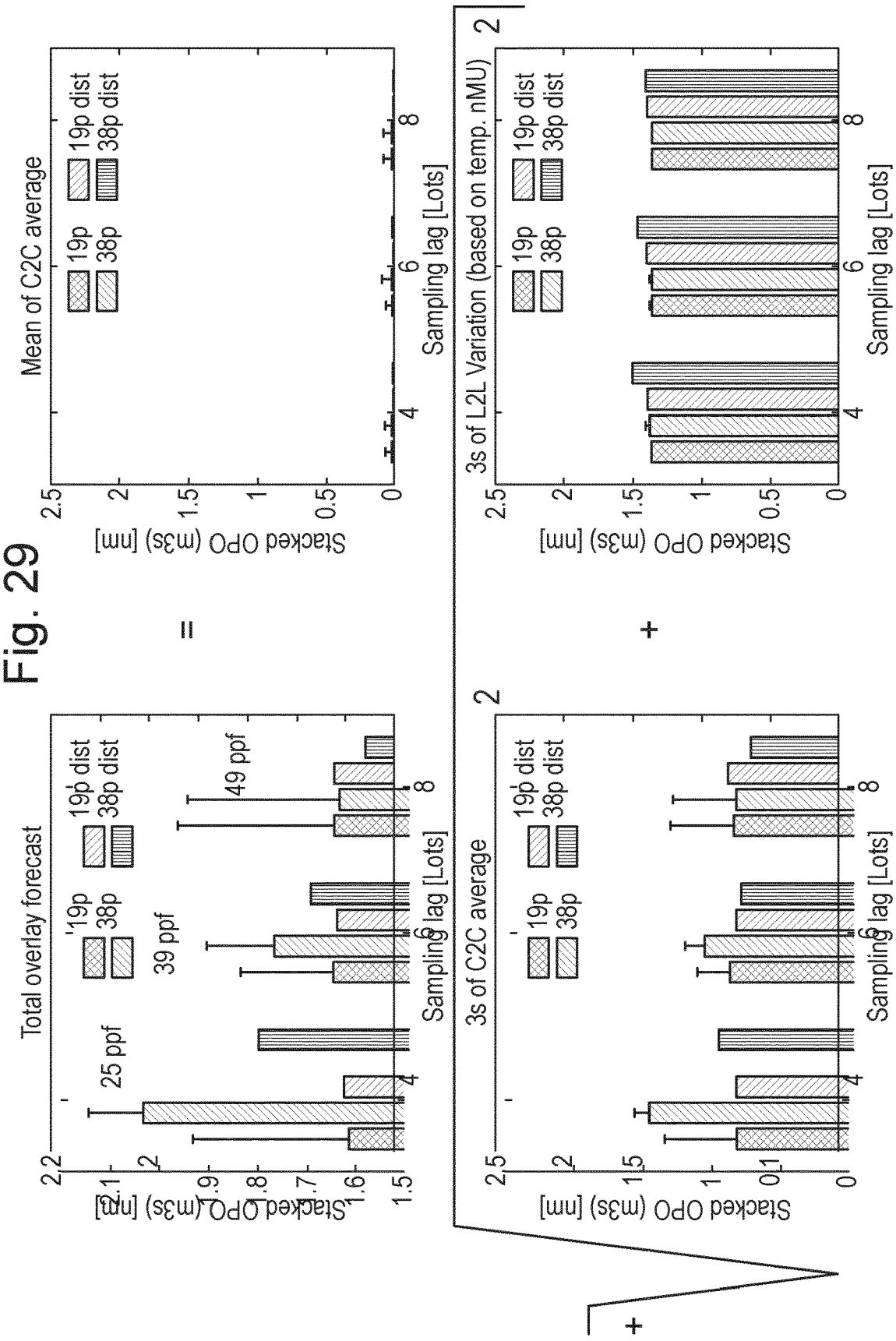
Figure 30:
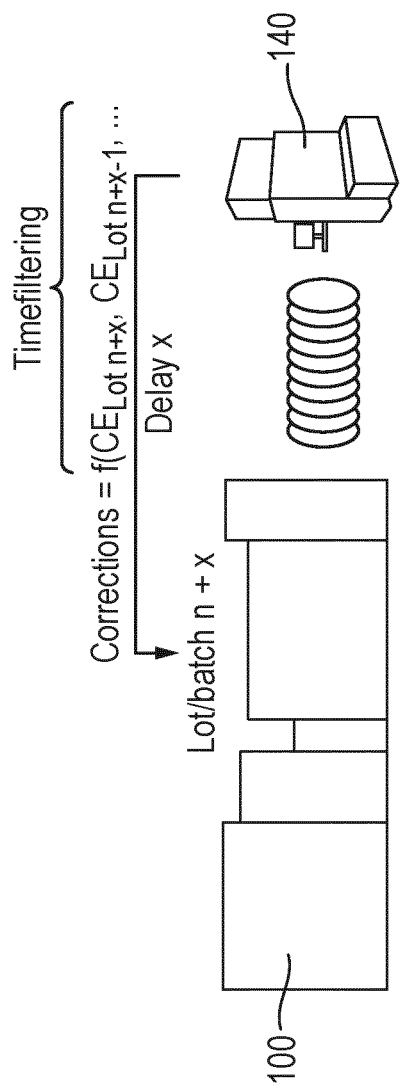
Figure 31:
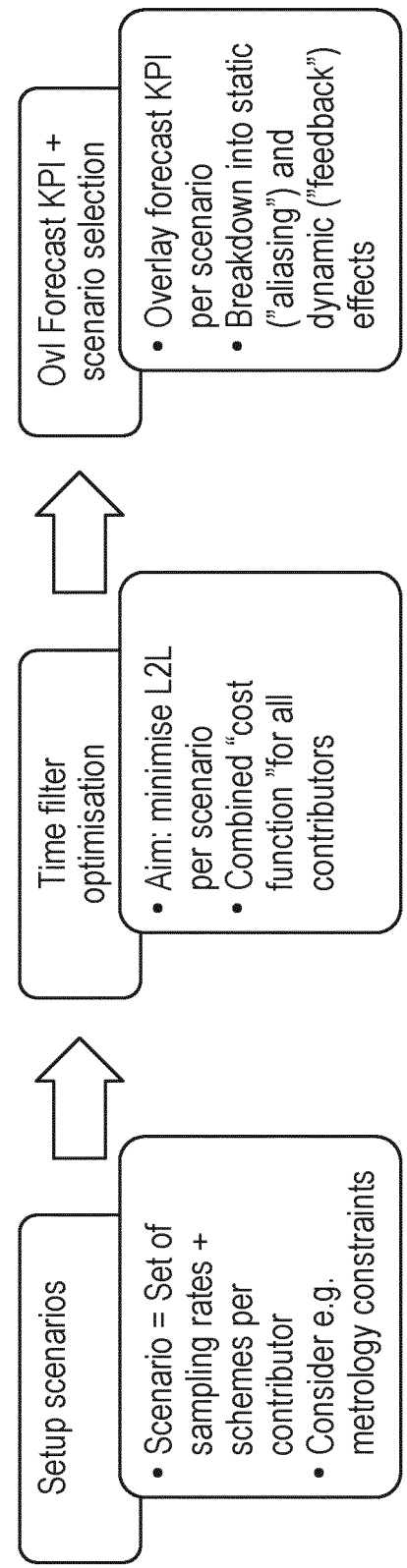
Figure 32:
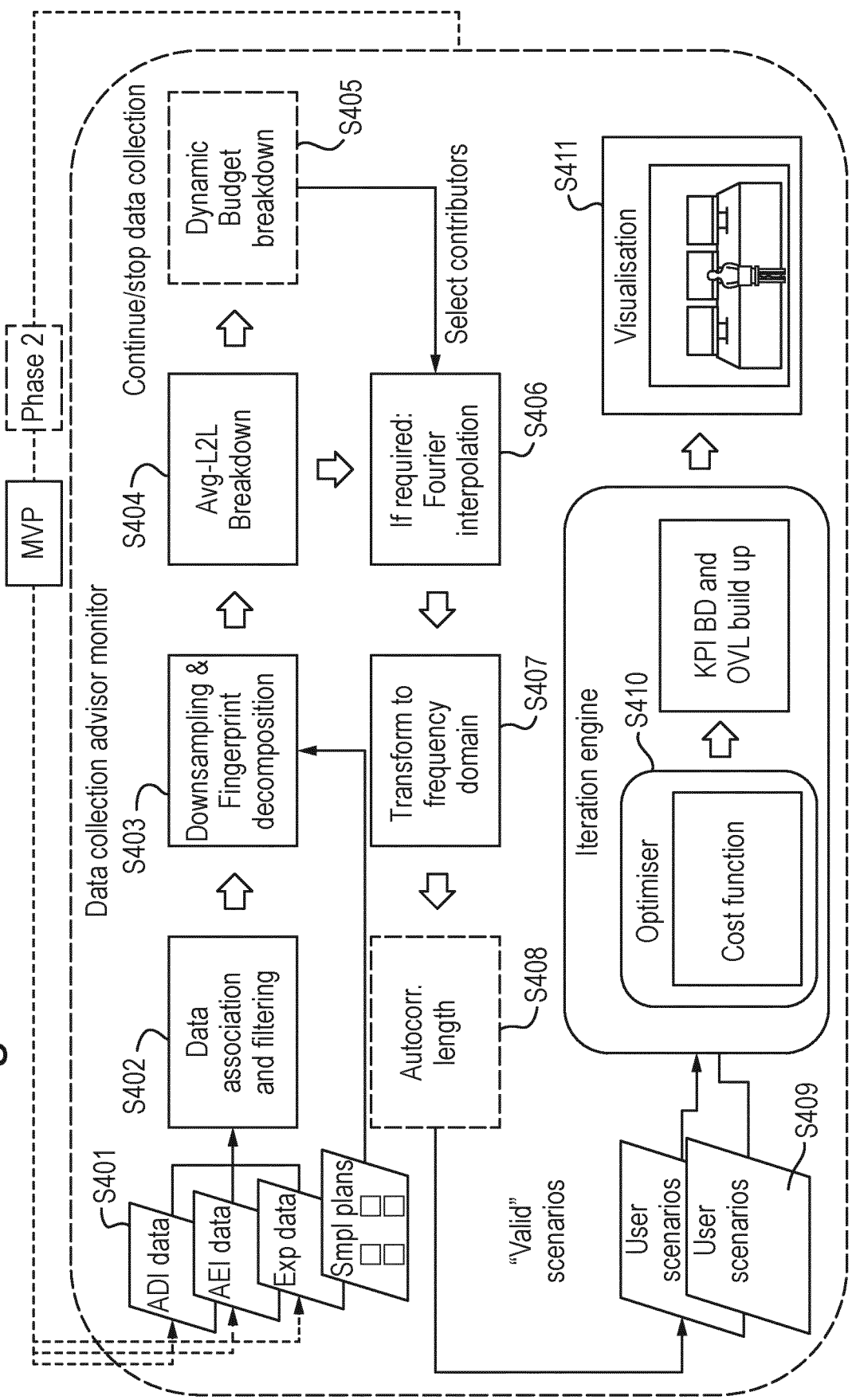

FIG. 25 depicts the relationship between power spectral density and temporal autocorrelation function in yet another example;

FIG. 26 depicts how an overlay forecast is built up from different contributors in an example;

FIG. 27 depicts the power spectral density and autocorrelation functions for after development and after etch measurements in an example;

FIG. 28 depicts various temporal and spatial sampling schemes;

FIG. 29 depicts how an overlay forecast is built up from different contributors in another example;

FIG. 30 depicts a feedback loop in an embodiment of the invention;

FIG. 31 depicts a process for adjusting a manufacturing process according to an embodiment of the invention; and FIG. 32 depicts a process for adjusting a manufacturing process according to another embodiment of the invention.

DETAILED DESCRIPTION

Before describing embodiments of the invention in detail, it is instructive to present an example environment in which embodiments of the present invention may be implemented.

Figure 1:
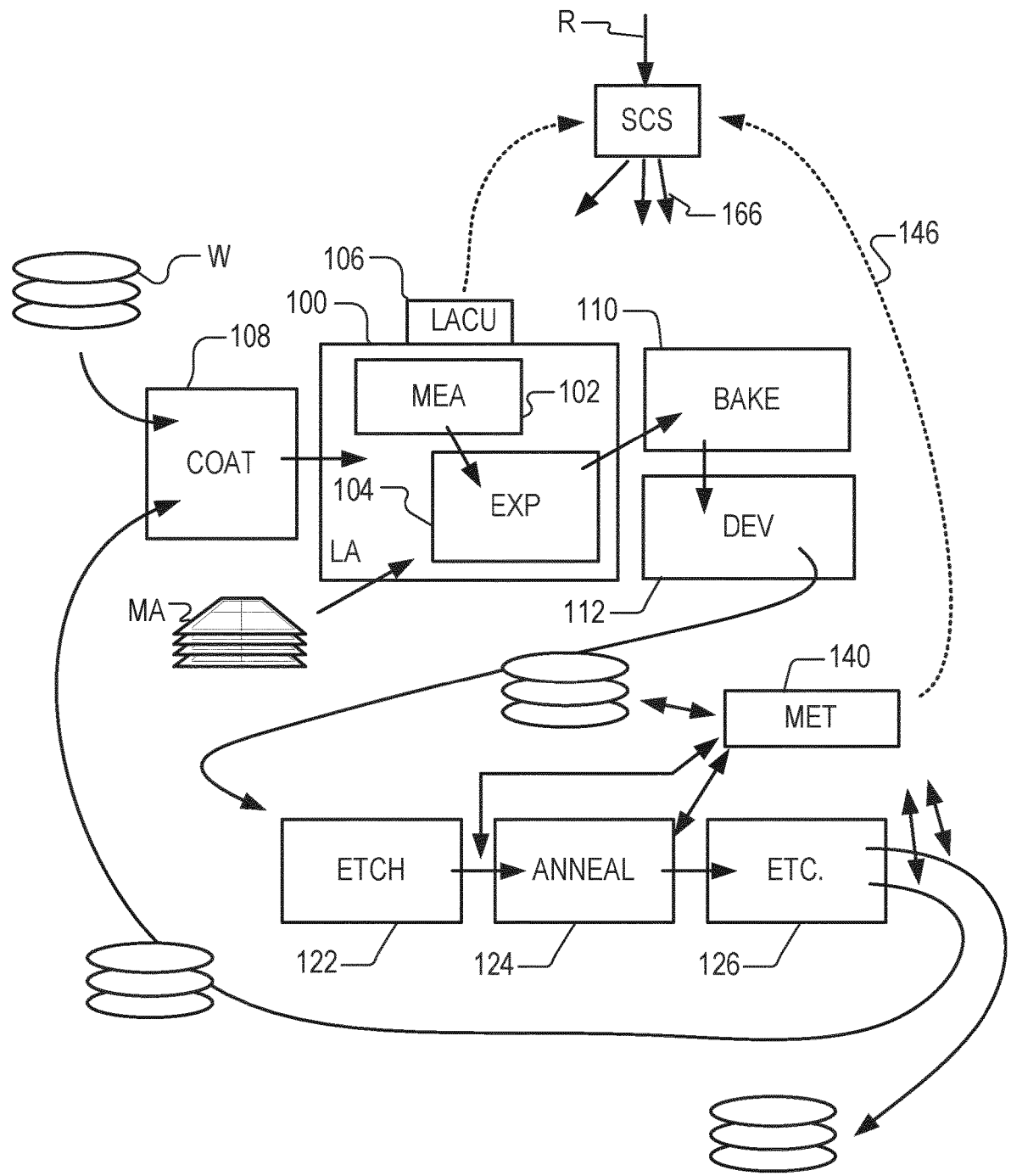
FIG. 1 depicts a lithographic apparatus together with other apparatuses forming a production facility for semiconductor devices.

FIG. 1 illustrates a typical layout of a semiconductor production facility. A lithographic apparatus 100 applies a desired pattern onto a substrate. A lithographic apparatus is used, for example, in the manufacture of integrated circuits (ICs). In that instance, a patterning device MA, which is alternatively referred to as a mask or a reticle, comprises a circuit pattern of features (often referred to as "product features") to be formed on an individual layer of the IC. This pattern is transferred onto a target portion (e.g., comprising part of, one, or several dies) on a substrate W (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles aligned in accordance to a Cartesian two-dimensional coordinate system (e.g. aligned along an X and an Y-axis, both axes being orthogonal to each other).

A requirement on the lithographic apparatus is an accurate reproduction of the desired pattern onto the substrate. The positions and dimensions of the applied product features need to be within certain tolerances. Position errors may occur due to an overlay error (often referred to as "overlay"). The overlay is the error in placing a first product feature within a first layer relative to a second product feature within a second layer. The lithographic apparatus minimizes the overlay errors by aligning each wafer accurately to a reference prior to patterning. This is done by measuring positions of alignment marks which are applied to the substrate. Based on the alignment measurements the substrate position is controlled during the patterning process in order to prevent occurrence of overlay errors.

An error in a critical dimension (CD) of the product feature may occur when the applied dose associated with the exposure 104 is not within specification. For this reason the lithographic apparatus 100 must be able to accurately control the dose of the radiation applied to the substrate. CD errors may also occur when the substrate is not positioned correctly with respect to a focal plane associated with the pattern image. Focal position errors are commonly associated with non-planarity of a substrate surface. The lithographic apparatus minimizes these focal positon errors by measuring the substrate surface topography using a level sensor prior to patterning. Substrate height corrections are applied during subsequent patterning to assure correct imaging (focusing) of the patterning device onto the substrate.

To verify the overlay and CD errors associated with the lithographic process the patterned substrates are inspected by a metrology apparatus 140. A common example of a metrology apparatus is a scatterometer. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. Another example of a metrology tool is an electron beam (e-beam) based inspection tool such as a scanning electron microscope (SEM).

Within a semiconductor production facility, lithographic apparatus 100 and metrology apparatus 140 form part of a "litho cell" or "litho cluster". The litho cluster comprises also a coating apparatus 108 for applying photosensitive resist to substrates W, a baking apparatus 110, a developing apparatus 112 for developing the exposed pattern into a physical resist pattern, an etching station 122, apparatus 124 performing a post-etch annealing step and possibly further processing apparatuses, 126, etc. The metrology apparatus is configured to inspect substrates after development (112) or after further processing (e.g. etching). The various apparatus within the litho cell are controlled by a supervisory control system SCS, which issues control signals 166 to control the lithographic apparatus via lithographic apparatus control unit LACU 106 to perform recipe R. The SCS allows the different apparatuses to be operated giving maximum throughput and product yield. An important control mechanism is the feedback 146 of the metrology apparatus 140 to the various apparatus (via the SCS), in particular to the lithographic apparatus 100. Based on the characteristics of the metrology feedback corrective actions are determined to improve processing quality of subsequent substrates.

The performance of a lithographic apparatus is conventionally controlled and corrected by methods such as automated process control (APC) described for example in US2012008127A1. The automated process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is very effective in suppressing drift phenomena associated with the lithographic apparatus.

The processing of metrology data to generate corrective actions performed by the processing apparatus is important for semiconductor manufacturing. In addition to the metrology data also characteristics of individual patterning devices, substrates, processing apparatus and other context data may be needed to further optimize the manufacturing process. The framework wherein available metrology and context data is used to optimize the lithographic process as a whole is commonly referred to as part of holistic lithography. For example context data relating to CD errors on a reticle may be used to control various apparatus (lithographic apparatus, etching station) such that said CD errors will not affect the yield of the manufacturing process. Subsequent metrology data may then be used to verify the effectiveness of the control strategy and further corrective actions may be determined.

Automated process control often aims to control, e.g. reduce, lot-to-lot variations in substrate fingerprints in process parameters such as overlay, focus and CD. A "fingerprint" is the variation of a parameter (or error in a parameter) over area. An intrafield fingerprint is the variation across a field and in some cases will be the same for all the fields on a substrate. A substrate fingerprint is the variation across the whole substrate. In some cases, a substrate fingerprint can be separated into an intrafield fingerprint and a interfield fingerprint. The present invention concerns all types of fingerprint.

A conventional APC correction in high volume manufacturing (HVM) conditions is based on feedback. Measurements obtained from a plurality of preceding substrates $W_{N-1}$ to $W_{N-x}$ are used to control one or more process parameters of a current substrate $W_N$. The measurements, or correction parameters derived from individual measurements, are grouped together and fed into a moving average (MA), for example an exponentially weighted moving average (EWMA).

In more sophisticated cases, a certain MA is applied for interfield and intrafield corrections and another type of MA for high-order (such as correction per field) corrections. In even more sophisticated cases, certain layers get fed some of the corrections determined on a previous layer if the two layers are expected to display very similar fingerprints. However, even these schemes have several drawbacks.

Currently, setting up an APC control strategy such as an after-etch overlay control strategy is a very cumbersome and convoluted process, as it involves multiple parallel control loops utilizing and combining after-development and after-etch overlay data. The complexity arises from the different metrology load constraints and the delays introduced between after-development and after-etch measurements by the substrate processing (e.g. the etch and other fixing steps). In this disclosure, the term "after-etch" should be read as encompassing measurements taken after other process steps. Some building blocks exist to select models and samplings based on after-development data, but sampling frequency and time filter settings are currently only "guestimated" using computational heavy run-to-run simulations or optimized in a reactive way through statistical process control (SPC) (if optimized at all). Furthermore, currently existing functionality does not take into account the interdependencies between after development, metrology to device and higher order after etch fingerprints.

WO 2018228750 A1, which document is hereby incorporated by reference in its entirety, describes a generalized application, where metrology load and correction models are optimized for different time domains of lot-to-lot variation. WO '7850 describes methods to fine tune APC feedback loops for reduced lot-to-lot variation in process parameters and/or allow decreased metrology sampling. Metrology measurements obtained from a plurality of preceding substrates $W_{N-1}$ to $W_{N-x}$ is used together with status data to control one or more process parameters of a current substrate $W_N$. Status data relates to conditions pertaining in one or more process tools, such as an etcher or annealer, when relevant layers on substrates $W_{N-1}$ to $W_{N-x}$, were processed by those tools.

The information derived from metrology measurements can be provided in the format of a data time series, that is a series of data values each associated with a time. It should be noted that the time associated with a data value is not necessarily the time at which the measurement was made but rather the time at which a relevant manufacturing step, e.g. an exposure, was performed on the structure or target measured. The aim of the metrology steps and of providing the metrology data as a time series is to infer time variation in conditions prevailing in a manufacturing tool, e.g. a lithographic apparatus. The information derived from metrology measurements can be the actual measurement results themselves or modeled parameters—such as translation, rotation, scaling, etc.—derived from the actual measurement results.

A difficulty in applying known automatic process control methods is that information on how the different measured errors—for example after-develop inspection (ADI), after-etch inspection (AEI) and metrology-to-device (MTD) offsets—contribute to after-etch overlay is lacking. In currently available budget breakdown methodologies, the lot-to-lot (L2L) variation is treated as an indivisible factor, whereas part of it could be controlled for with the correct control strategy, making it difficult to select the right building blocks of the strategy. As a result, a control loop set up according to conventional approaches might either not be sufficient to harvest the full (or sufficient) correction potential, or alternatively might be too complex and costly with respect to the available correction potential. Current strategies to assess these contributions and their variations in a control context rely on computationally costly run-to-run (R2R) simulations, which also lack coverage of the available parameter space to harvest the full optimization potential.

Another disadvantage of known automatic process control methods is that it is difficult to optimize the sampling rate of the different measurement processes so as to balance correction potential and metrology load. Currently these settings are based on experience and often tuned reactively (if at all) as part of the statistical process control (SPC), because brute force run-to-run simulations may be too time consuming to run for a multitude of potential settings with sufficient coverage. Also run-to-run simulations will always lack the detailed insight as to what makes an optimal setting optimal in order to verify its validity. In unlucky cases, the sampling rate of the input data might be in the same range as the dominant variation, effectively amplifying the noise and dialing it back into the control loop as low-frequency or even average content.

Another disadvantage of known automatic process control methods is that it is difficult to choose appropriate time filter settings to optimally capture wanted and suppress unwanted lot-to-lot variation. Whereas for simple, single parameter filters, it might be sufficient to brute force optimize the parameter value, other more complex filters might be needed to harvest the full correction potential with respect to lot-to-lot variation. For the design and optimization of these filters, the brute force approach is too inefficient and error prone (due to limitations in coverage of the parameter space), and more insight on the behavior of these filters in the frequency domain is needed.

For the latter two disadvantages, it is also desirable to separate transient (convergence) effects from steady-state (stable run-to-run) effects. Especially on short datasets, these effects will be intermixed in classical run-to-run simulations, leading to potentially wrong conclusions for the long-term.

Current model and sampling advice strategies treat some variations, e.g. lot-to-lot variations, as indivisible and do not distinguish the capturable and non-capturable (in a run-to-run context) portions. This might lead to suboptimal model and sampling selections for different run-to-run situations in high-volume manufacturing (HVM), utilizing different sampling rates and time-filtering strategies.

Figure 2:
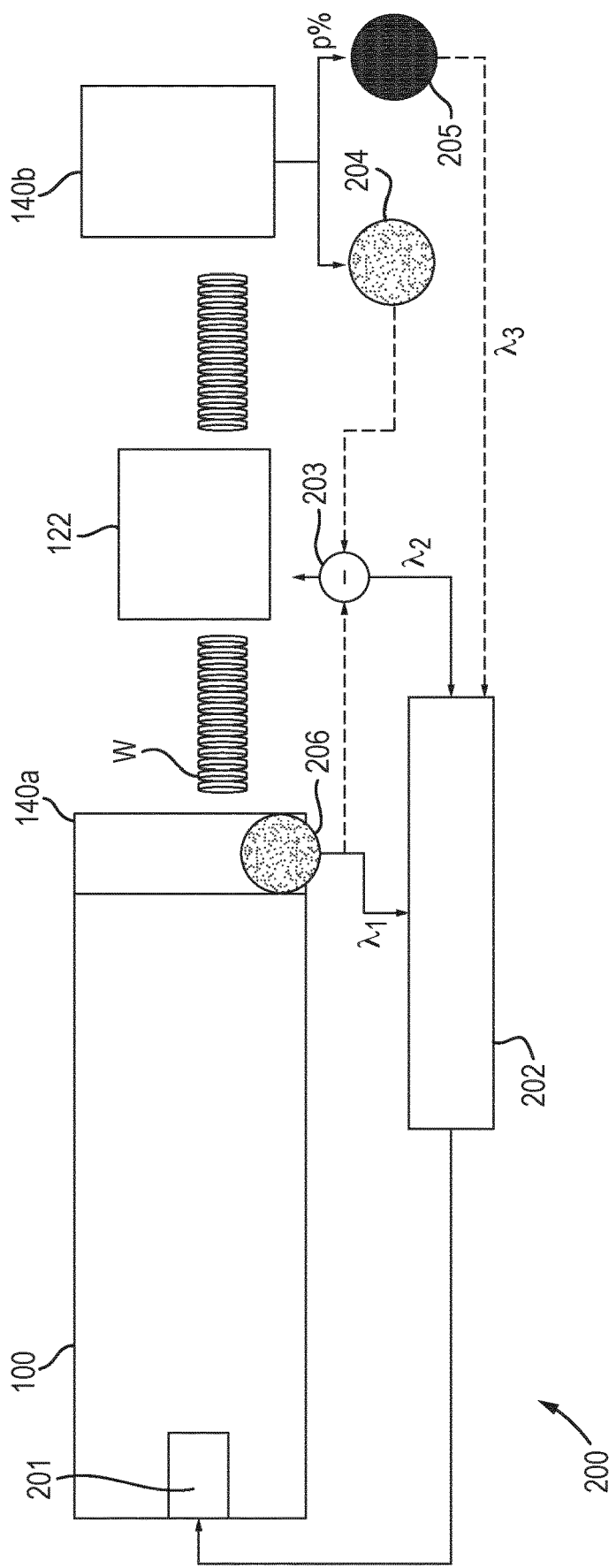
FIG. 2 depicts an automated process control method according to an embodiment of the invention.

FIG. 2 depicts a control scheme 200 in which the present invention can be applied. A lithography apparatus 100 exposes substrates which are then developed and measured by first metrology device 140a using after-development sampling scheme 206. In some cases all substrates are measured after development but in other cases only a sample are measured. The exposed wafers are processed by process tool 122 (e.g. an etcher) to perform a pattern transfer step. Second metrology device 140b measures the substrates after the pattern transfer step. A certain proportion m % of the substrates may be measured using a sparse sampling scheme 204 and another proportion p % may be measured using a dense sampling scheme 205. Proportions m % and p % may be different and need not add up to 100%.

Measurements from first metrology device 140a and second metrology device 140b may be compared 203 and used to generate process corrections that are applied to the pattern transfer step.

A controller 202 receives the measurements from the first metrology device 140a, the process corrections and measurements for the second metrology device 140b with respective time constants $\lambda_1$, $\lambda_2$ and $\lambda_3$. Controller 202 applies filters to its inputs and provides control signals (corrections) to the lithography apparatus 100 via control interface 201. Other arrangements are possible as discussed below.

The present invention proposes a methodology to reduce an error of interest which may include various of the following building blocks. In particular there are three main steps.

In a first main step, a strategy is built by identifying the relevant contributors to the error and recommending an appropriate set of sampling rates and time filter settings per contributor, using existing models and sampling schemes being utilized. A breakdown of the on-product overlay (OPO) or other measure of interest is provided per contributor, with an extended degree of granularity at the lot-to-lot level. Such a breakdown makes it possible to assess which part of the lot-to-lot variation can be captured with the current timefilter, which part of the theoretically capturable variation is not captured by the current timefilter, and which portion is not capturable at all via a feedback loop, requiring other means of control.

In a second main step, the strategy is optimized, by adjusting model parameters (and the corresponding run-to-run control parameters) and sampling plans (e.g. the number of points & wafers as well as candidate positions, as well as distribution of the points over the lots) to the frequency characteristics of the underlying lot-to-lot variation.

For the sampling aspect, it is also important in this step to balance (or co-optimize) the spatial sampling density of the measurements on the wafers to be measured against the temporal sampling frequency in order to minimize said error of interest.

The model optimization should take into account different temporal behavior of the different parameters, while keeping the complexity of the control loop at acceptable levels, e.g. by grouping model parameters that would receive similar time filter settings or require similar sampling densities, schemes or rates, or eliminating model parameters, that would contribute more noise than actual correctable content to the control loop.

In a third main step, the obtained recommendations can optionally be validated and fine-tuned using a selected, narrow set of regular run-to-run simulations.

In an embodiment, the first main step can be realized by the following substeps.

Figure 8:
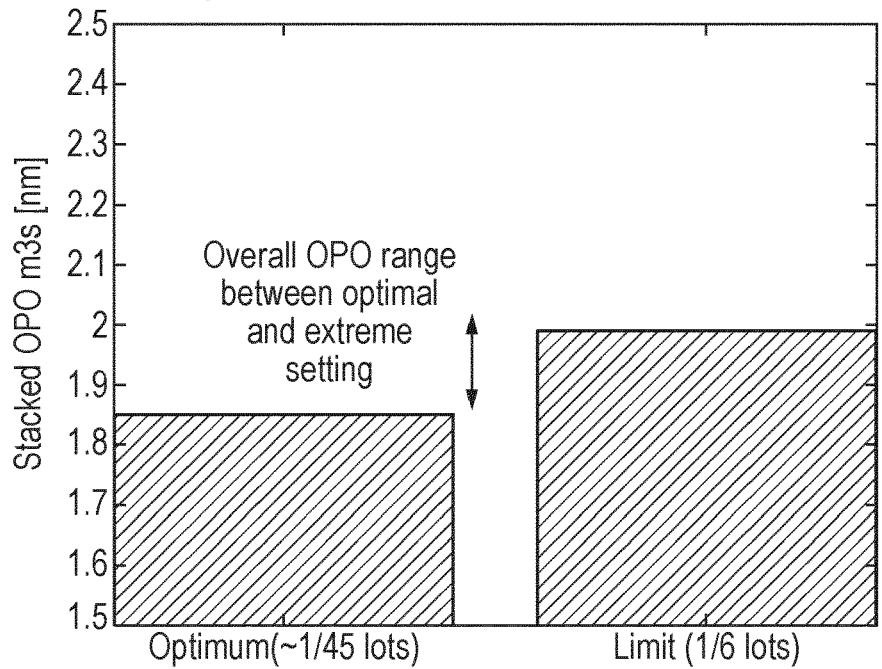
FIG. 8 depicts a forecast of overlay values using different time filters.
Figure 9:
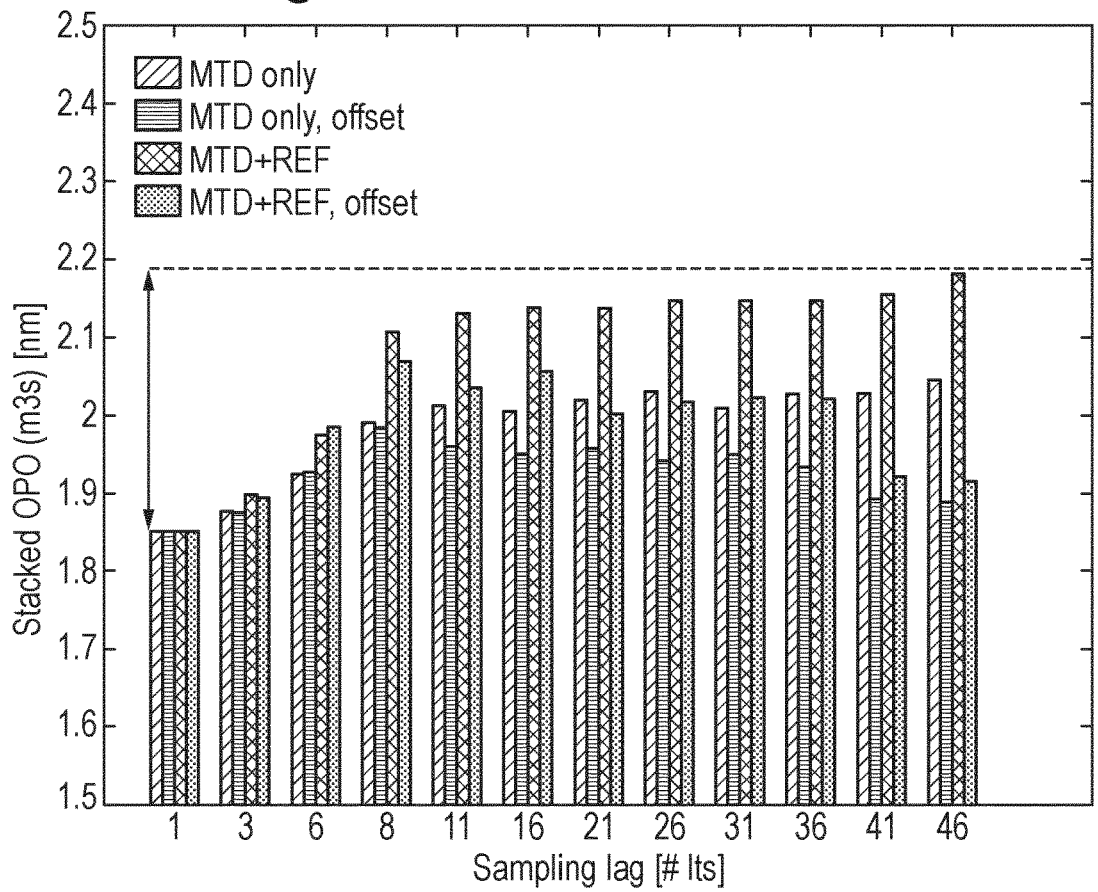
FIG. 9 depicts a forecast of overlay values using different sampling rates.

As depicted in FIG. 3, lot-to-lot variation of a dataset is broken down into frequency spectra $sp_1$ to $sp_n$ of its inherent lot-to-lot variation per contributor (e.g. ADI, MTD, AEI) by a Fourier transform. This can be done at parameter level or per measurement position. The Fourier transform can be preceded by a modelling step in order to split correctable and non-correctable portions of the overlay (or CD or other measure) fingerprints $f_1$ to $f_n$ contained in the dataset, as well as by splitting average field from wafer contribution (as shown in FIGS. 8 and 9).

Figure 4:
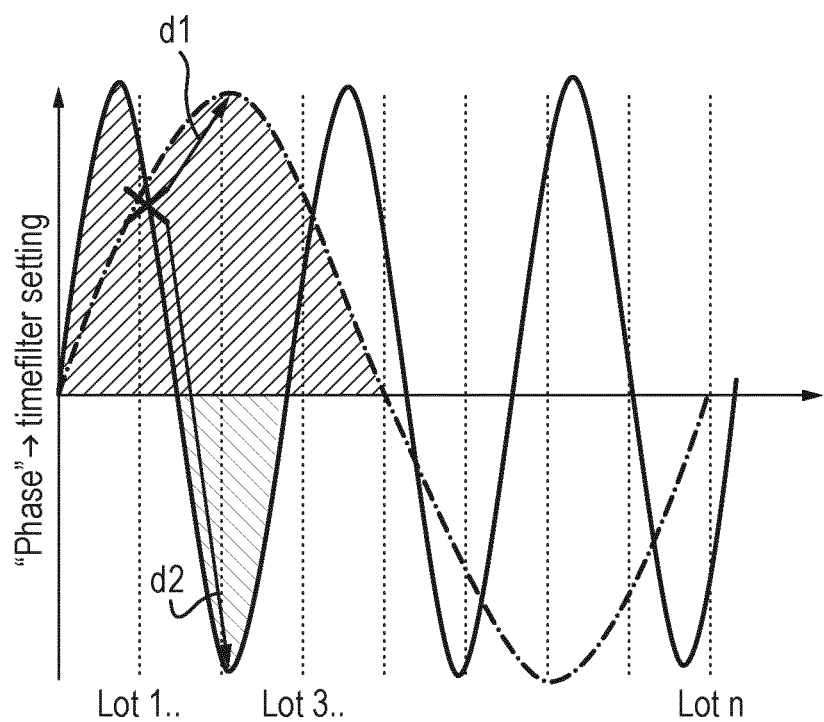
FIG. 4 depicts phase effects of a time-varying control signal on a time-varying error signal.

A set of KPIs to determine the optimal time filter transfer function $t_f$ is obtained based on the frequency spectra obtained from the Fourier transform described above. In an embodiment, the time filter setting $t_f$ is a function of frequency that is constant below a certain correction frequency $f_c$ and decreases above the certain correction frequency $f_c$. As shown in FIG. 4, the goal of the KPIs is to optimize the ratio between the low frequency components of the lot-to-lot variation that can be fed back constructively (i.e. leading to a reduction in overlay), but are to some extent dampened by the filter, and high frequency components, that can only be fed back destructively (i.e. leading to an increase in overlay), which might be partially passed on by the filter. The constructive region is shown in right hatching in FIG. 4 and the destructive region in left hatching. This optimization is done taking into consideration the phase shift that is caused by the time filter itself, and the delay introduced by the fact that corrections based on overlay measurements are typically only applied on subsequent lots. As can be seen in FIG. 4, a correction is likely constructive if the delay d1 between a measurement and the correction being applied is much smaller than the period of the error, desirably less than ⅙ of the period of the error. A correction is likely destructive if the delay d2 is equal or higher than half of the period of error.

Since the underlying mathematical equations are much less complex in the frequency domain than in the time domain (multiplication and convolution, respectively), complex filter designs can be realized by solving/optimizing a set of algebraic equations, instead of integral equations, enabling the efficient use of optimizing algorithms such as gradient descent as discussed below.

Further, this approach can be used to develop adaptive filters, that automatically adjust to changes in the frequency composition of the input data generated continuously in a run-to-run scenario.

Below, a simple example of using algebraic equations derived from a frequency domain description of time filtering and delay to optimize parameterized filters is described. The gradient descent approach could be replaced by more elaborate optimizers such as L-BFGS-B (a limited-memory quasi-Newton code for bound-constrained optimization by Ciyou Zhu, Richard Byrd, Jorge Nocedal and Jose Luis Morales) that allow constraints for the parameters to be set such as to avoid negative values or values >1.

A generalized transfer function describing filtering and delay introduced by the feedback loop is as follows:

$$H(f) = \Sigma_{m=0}^{l} b_m \times e^{-i2\pi f m} \quad (1)$$

where l is the maximum number of parameters or past lots to be taken into account.

The cost function to be minimized is:

$$J(b_1, \ldots, b_l) = \frac{|\hat{A} - \hat{B}|^2}{|\hat{A}|^2} = \frac{\sum_{k=0}^{N-1} (1 - 2|H_k| \cdot \cos(\phi_k) + |H_k|^2) \cdot |\hat{A}_k|^2}{\sum_{n=0}^{N-1} |\hat{A}_k|^2} \quad (2)$$

where $A_k$ is the complex value of a discrete Fourier transform of the lot-to-lot variation at frequency $f_k$.

Optimization via gradient descent gives:

$$b_{i,j} = b_{i,j-1} - \alpha \frac{\partial}{\partial b_i} J(b_1, \ldots, b_l) \quad (3)$$

where j is the iteration number and a is the step parameter of gradient descent.

The above approach treats the input data such that the steady state behavior of the time filter (which is important for long term stability) is adjusted independently from its transient/convergence behavior), by first removing the average (or average per substrate holder) contribution from the input data before performing the Fourier transform on the remaining contributor.

Based on the time filter settings determined as above, the lot-to-lot variation per contributor can be broken down into different frequency bands according to: the portion that the time filter can capture constructively (i.e. in a way that reduces lot-to-lot variation); the upper limit of capturable lot-to-lot variation that could be theoretically captured with ideal, zero-lag time filters; and the portion that cannot be captured by a feedback loop due to its high frequency variation.

Figure 7:
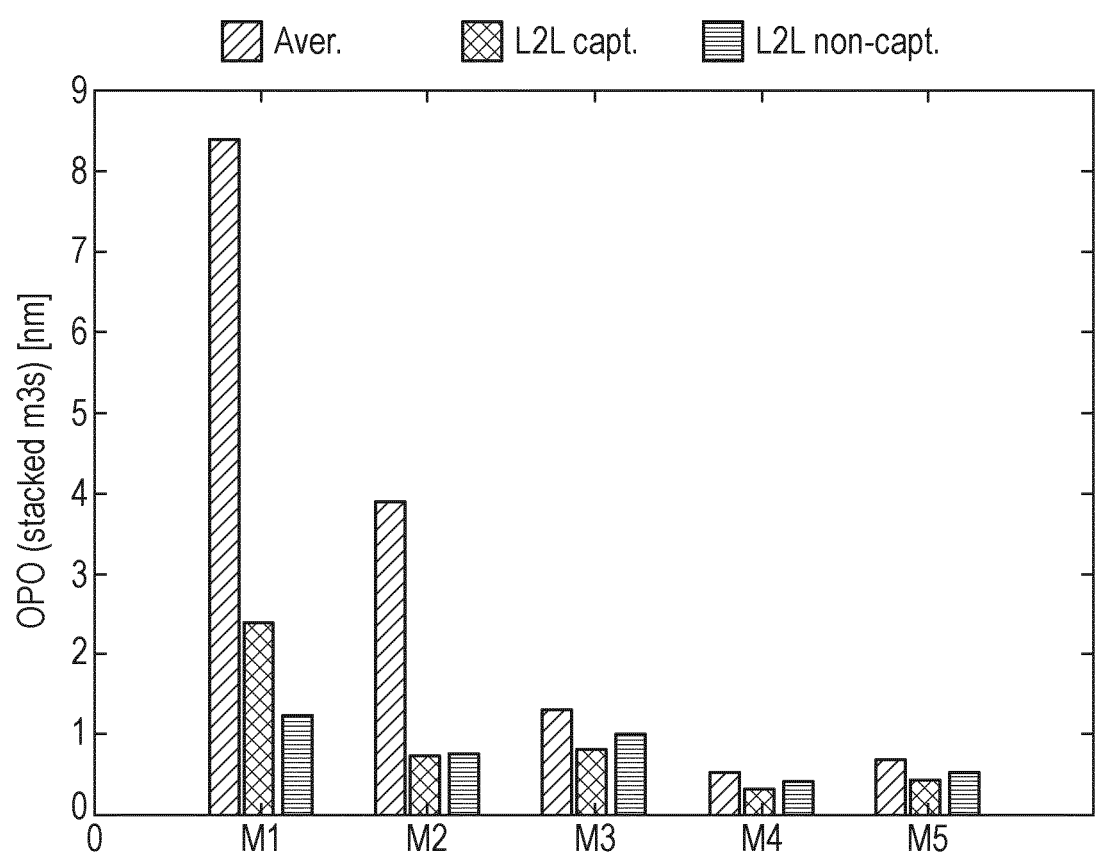
FIG. 7 depicts a breakdown of an error between contributors and components of variation (static average component, slow moving capturable lot-to-lot variation component and fast moving, non-capturable lot-to-lot variation component)

The resulting breakdown of the error provides an overview of the correctable and capturable static and dynamic contributors and their overlay contribution, based on which the relevant components, required model orders, and time filter settings can be chosen to build up an after etch control strategy. An example of such a breakdown is shown in FIG. 7. This figure shows a breakdown of on-product overlay budgets at different measurement stages and strategies M1 to M5 split between average (right hatching), lot-to-lot capturable (cross-hatching) and lot-to-lot non-capturable (horizontal hatching). The breakdown also indicates if different time filters or even approaches (e.g. feedforward) are needed to better capture lot-to-lot variation. It can be recalculated for various choices of available time filters to select the optimal one.

An appropriate choice of above KPI might also directly allow to calculate the above breakdown in the frequency domain directly, without the explicit need to transform back into the time domain, since the power spectral density approach utilized to construct the cost function directly represents the variance of the data set. This allows for a low-cost forecast of the performance gain or detriment based on the final value of the cost function after optimization.

With the average substrate removed, the average power spectral density over all points represents the distribution of variance across the frequency range. That the average PSD is equivalent to the variance utilized, e.g. in the stacked m3s overlay metric, can be seen from the following:

$$\sigma^2 = \sum_j^N \sum_i^M \frac{(\bar{x} - x_{ij})^2}{N \cdot M} = \sum_i^M \frac{1}{M} \sum_j^N \frac{1}{N} \left( \sum_m^M \frac{1}{M} \sum_n^N x_{mn} N - x_{ij} \right)^2 \quad (4)$$

where i,m ... M are the point indices and j,n ... N are the wafer indices. Since the average wafer is removed in cases where σ represents the lot-to-lot variation $$\sum_n^M \frac{1}{M} \sum_n^N \frac{x_{mn}}{N} = 0.$$

Therefore, equation 4 simplifies to $$\sigma^2 = \sum_i^M \frac{1}{M} \cdot \frac{1}{N} \sum_j^N (x_{ij})^2 = \sum_i^M \frac{1}{M} \cdot \frac{1}{N} \sum_k^N |x_{ik}|^2 \quad (5)$$

where $x_{ik}$ is the discrete Fourier transform at frequency $f_k$, position i. The second part of the equation utilizes Parseval's theorem. Utilizing the definition of the PSD, equation 5 can be expressed as $$\sigma^2 = \sum_i^M \frac{1}{M} \cdot \sum_k^N PSD_{ik} \quad (6)$$

where $PSD_{ik}$ is the power spectral density of point i at frequency $f_k$.

An example of a forecast is shown in FIG. 8 which shows the difference in on-product overlay OPO when using an optional time filter frequency and an extreme time filter frequency. An improvement of more than 0.1 nm is achievable for the given dataset.

The above cost function can be extended, in order to derive a second KPI for choice of the appropriate sampling frequency for each contributor, by incorporating the effects of downsampling of the time series representing lot-to-lot variation and the resulting dynamic aliasing effects, where frequencies above half of the sampling frequency are wrongly picked up by the control loop as low frequent variations. The cost function changes then to $$J(b_1, \ldots, b_l) = \frac{|\hat{A} - \hat{B}|^2}{|\hat{A}|^2} = \frac{\sum_{k=0}^{N-1}\left(|\hat{A}_k|^2 - \hat{A}_k H_k^* \hat{A}_{k,ds}^* - \hat{A}_k^* H_k \hat{A}_{k,ds} + |H_k|^2|\hat{A}_{k,ds}|^2\right)}{\sum_{k=0}^{N-1}|\hat{A}_k|^2}, \quad (7)$$

where Ak,ds is the component of the Fourier transform of the downsampled signal at frequency fk. Here, the transfer function is modified according to:

$$H = H_{smear} \times H_{EWMA} \quad (8)$$

$$H_{EWMA}(f) = \frac{\lambda}{1 - (1-\lambda) \cdot e^{-i2\pi f \epsilon}} \quad (9)$$

$$H_{smear}(f) = \sum_{\epsilon=1}^{\epsilon} e^{-i2\pi f \epsilon} = e^{-i2\pi f \delta} \frac{1 - e^{-i2\pi f \epsilon}}{1 - e^{-i2\pi f}} \quad (10)$$

where δ is the delay between measurement and correction, and ε is the sampling "lag", indicating the difference in number of lots between two measurements. In this approach, for each value in a predefined set of ε the cost function is minimized to yield the optimal time filter settings, then the minimized cost function itself is used. Prior to calculating the cost function (7), the average fingerprint of the down sampled time series of fingerprints can be calculated and removed from the dataset, as this portion represents the static "DC" offset introduced by aliasing in form of a mismatch between the "measured" average over all lots, and the "real" average. The resulting overlay number can be used when calculating the overlay forecast. Provided that the process variation causing the aforementioned static/"average" aliasing fingerprint is stable, that average aliasing fingerprint can be utilized in order to compensate for this introduced average offset in a run to run situation with reduced sampling frequency, by applying it as a constant correction offset to the control loop. This is discussed further below.

FIG. 9 shows overlay OPO forecasts for different sampling lags. The forecasts shown are metrology-to-device (MTD) with and without offset and after-etch refinement (REF) with and without offset. MTD is a fingerprint typically added on top of after-development fingerprints that represents the lower order part of the after-develop to after-etch bias. Typically this fingerprint is refreshed less frequently than the ADI fingerprint and receives different time filter settings. REF is again an additional component of the after-etch control loop, but this time solely based on after-etch data, representing high to very high order corrections. FIG. 9 shows the overlay increase if the sampling frequency for the underlying after-etch measurements is reduced for both MTD and REF (or in other words the sample lag, meaning the delay in lots between two subsequent measurements is increased). Furthermore it is shown that the variability of the resulting on-product overlay in function of the sampling offset (e.g. the difference between measuring lot 1, 4, 7 . . . or 2, 5, 8 . . . ) can be quite high as soon as the sampling rate reaches the order of magnitude of the fundamental frequency of the variation of the underlying main overlay component. This is a result of aliasing.

Again, with an appropriate choice of the cost function as above, the effect of reduced sampling rate on the error of interest (e.g. overlay) can be forecast more or less directly with low additional computational effort.

Figure 10:
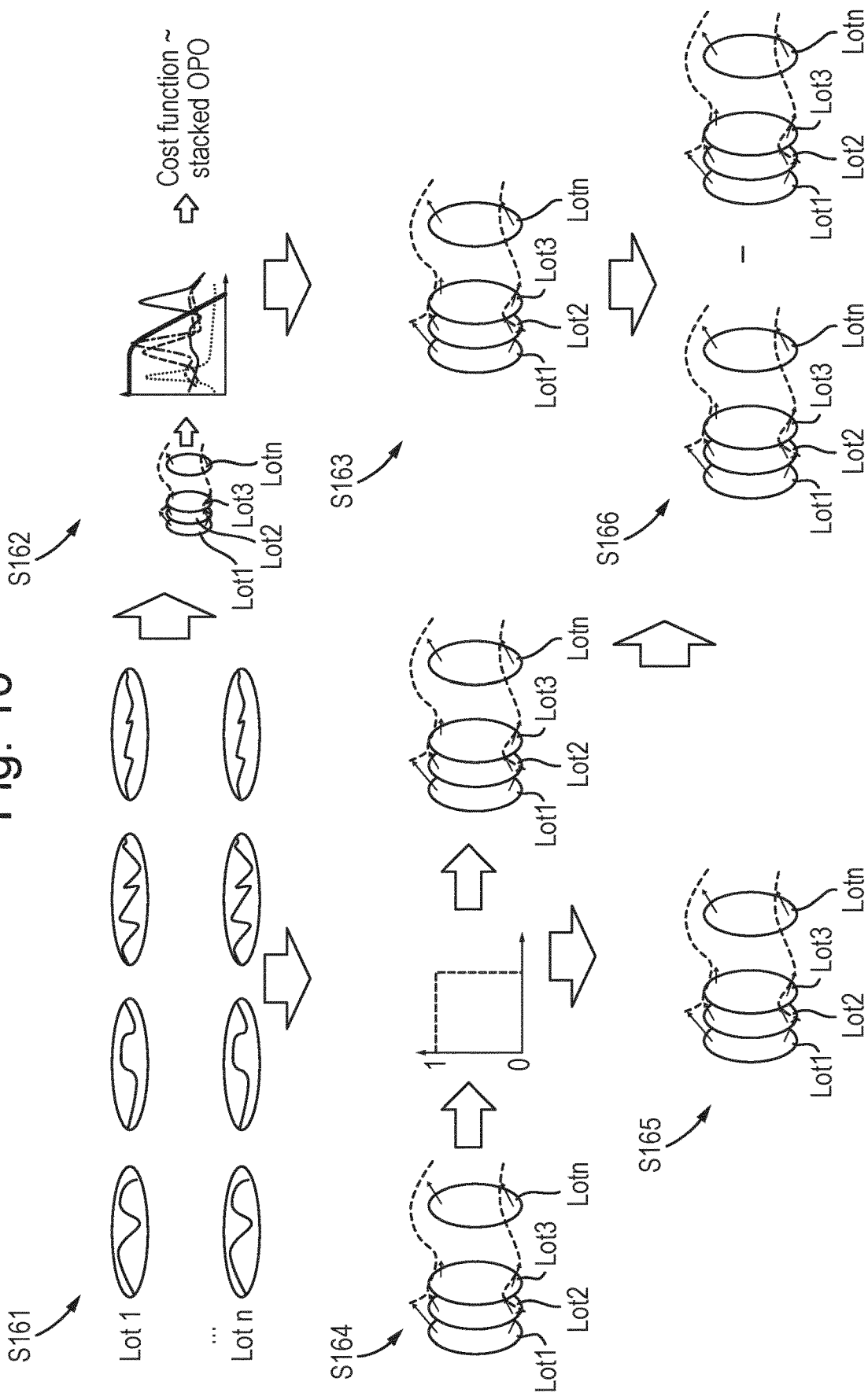
FIG. 10 depicts a process to calculate aliasing error.

The approach can be extended such that the lot-to-lot "error" fingerprint (each fingerprint representing a certain contributor) caused by aliasing can be determined by applying additional modulation to the original lot-to-lot variation in the frequency domain. This is shown in FIG. 10.

In step s161 fingerprints fp1 to fp4 are determined for each lot of wafers. Each fingerprint represents a specific contributor (e.g. ADI, MTD, refinement) to the error. In step S162, these fingerprints for a specific contributor are down-sampled in time (meaning all but the fingerprints for the "measured" lots at a given sample rate are set to 0). Then the time filter settings are optimized for the given sample rate and contributor.

In step S163, the resulting lot-to-lot variation is calculated, taking into account the time filter setting from step S162 and additional transfer function describing the resulting lot-to-lot fingerprint being stable in between measured lots (Eq. 10).

In Step S164, the fingerprints from step S161 for the specific contributor are taken and the lot-to-lot variation component is again extracted. If a dual stage lithographic apparatus is used then the lot-to-lot variation may be calculated per substrate stage. Then the fingerprints are transformed into the frequency domain and all high frequency components above half of the sampling rate (the Nyquist frequency) are set to 0, and the fingerprints are transformed back into the time domain.

Then in step S165, the resulting fingerprints are down-sampled again in time according to the sampling rate from step S162 and the resulting lot-to-lot variation is calculated after application of the time filter with the time filter settings from step S162.

In step S166, the delta between the lot-to-lot variation fingerprints obtained in steps S163 and S165 is calculated. The delta represents the effect of the frequency content of the lot-to-lot variation above the Nyquist frequency upon down-sampling and is further referred to as the "aliasing fingerprint". This process is repeated for all applicable sampling rates and contributors. In a run-to-run control situation, this "error" fingerprint will manifest itself both as additional low-frequency component of the resulting lot-to-lot variation of the error of interest, as well as an additional average (DC) offset depending on the magnitude of the aliasing.

Figure 11:
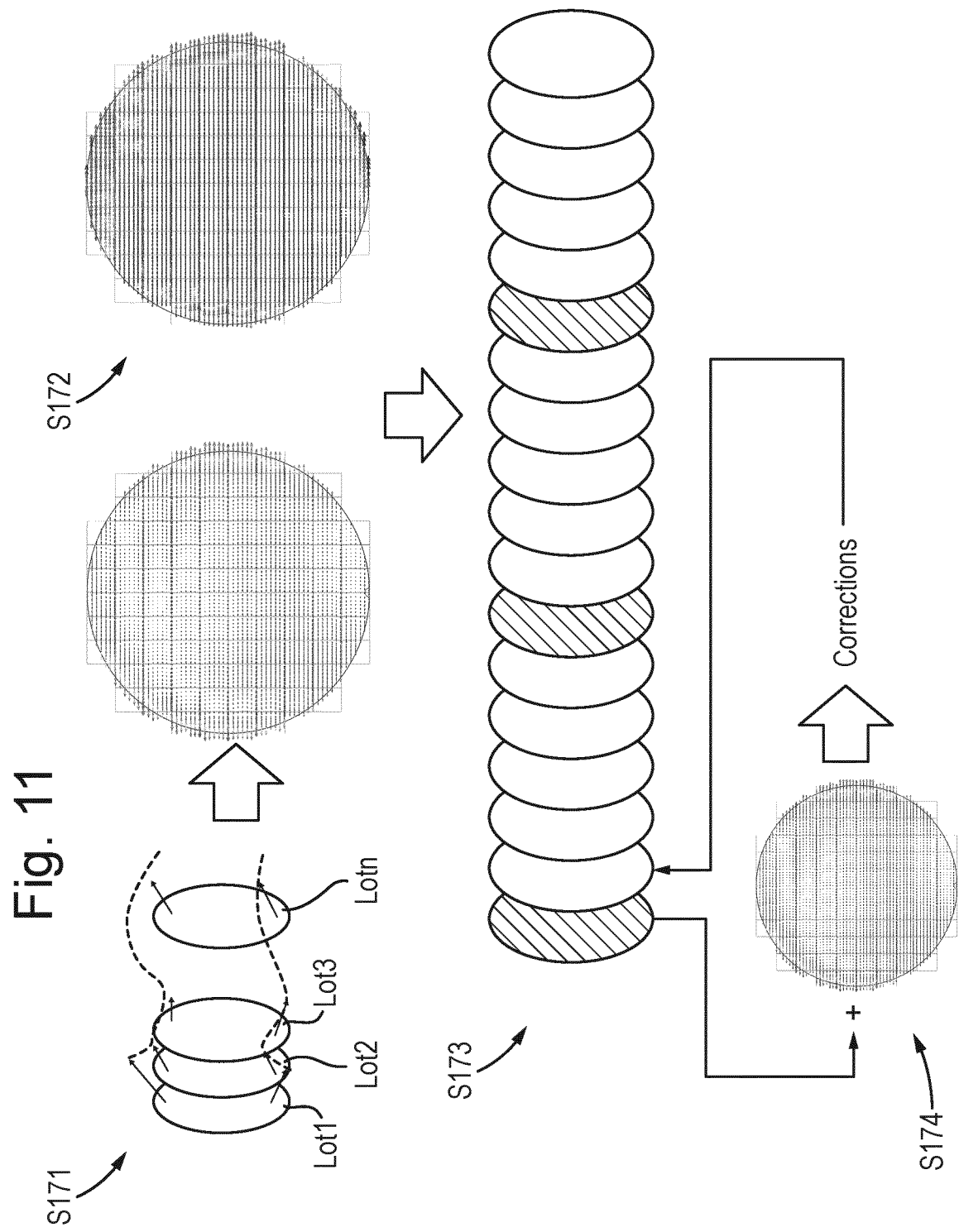
FIG. 11 depicts a process to apply a aliasing correction based on the calculated aliasing error

Provided that the average part of this aliasing fingerprints is stable over time, the average portion of fingerprint that was determined mathematically via a set of Fourier transformations and modulations in the frequency domain can then be utilized in order to compensate for this introduced average offset in a run-to-run situation with reduced sampling frequency, by applying it as a constant correction offset to the control loop. This is shown in FIG. 11 which depicts first the determination of the aliasing fingerprint on a first set of very frequently measured data (step S171) and the application of the average part of the aliasing fingerprint as a non-zero offset in step S172, when the control loop is indeed based on infrequent measurement of the control fingerprints according to the sampling rate for which the aliasing fingerprint was calculated.

The KPIs derived in the first main step, of building a strategy, can be applied locally, that means per measurement position. As such, candidate sampling positions can be selected or eliminated based on:

The (low frequency) capturable vs. (high frequency) non-capturable content they carry (taking into account the optimized time filter setting derived earlier).

The amount of aliasing they would introduce due to their high frequency content of the local error signal at that particular position in case of reduced sampling rates (again taking into account the optimized time filter setting derived earlier).

The sampling distributions can then be further optimized using existing techniques such as sampling scheme and target layout optimization to optimize inter- and intra-field distributions, respectively. The required number of sampling points could be derived using existing KPIs such as systematic and random residuals.

However, high density spatial measurements that might only become available after a pattern transfer step (e.g. etching) might require an additional degree of (co-)optimization in order to balance metrology load against performance potential, in order to fit, for example, Q-time constraints that exist after etching, where wafers have to arrive at the next process step within a certain timeframe. This can be achieved by combining KPIs for spatial sampling optimization (e.g. systematic residuals) with aforementioned KPIs for temporal optimization in order to minimize the overall error of interest. A potential outcome of this optimization might be, that spatial sampling density is reduced in order to enable more frequent measurements, such as to slightly reduce the capture efficiency for the average fingerprint, while significantly capturing and reducing lot-to-lot variation.

Figure 12:
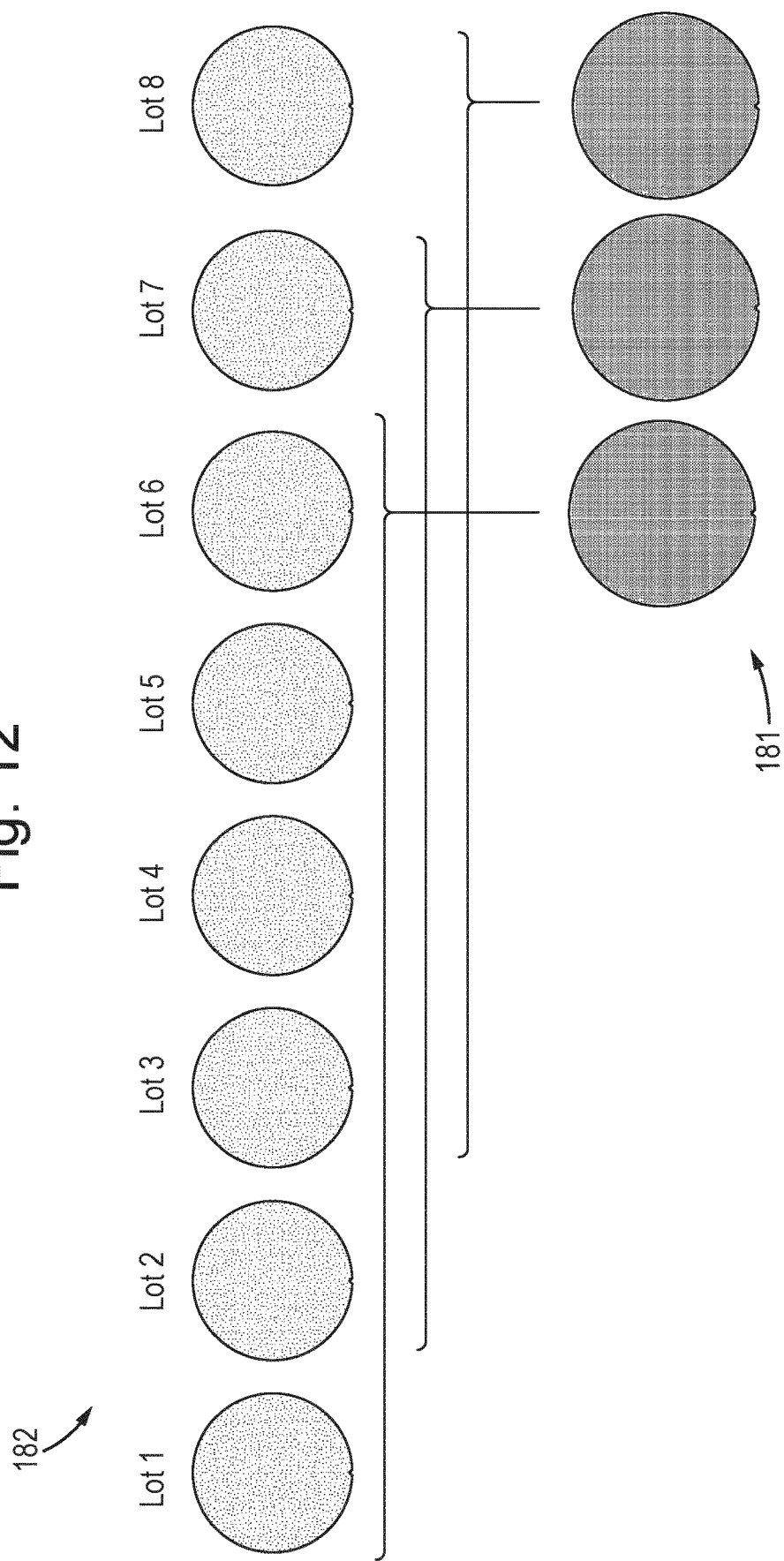
FIG. 12 depicts the distribution of a dense sampling scheme over a plurality of lots.

As shown in FIG. 12, a trade-off between sampling density and frequency can be further relaxed by distributing a dense sampling scheme 181 as several less dense sampling schemes 182-184 over multiple lots. The number of lots over which to distribute the sampling and the density of the combined sampling can be derived using the KPIs discussed above and a combination of KPIs.

The correction models can be optimized, by either introducing further granularity in the recommendation of time filter settings/parameters, through allowing to define custom and optimized time filters per model correctable terms, or by eliminating modelling terms that do not vary in the right frequency band, causing destructive feedback or even aliasing.

Having individual time filter settings per model parameter might introduce too much complexity into the control loop, if the total number of utilized model parameters is high. Model parameters with similar temporal behavior might therefore be grouped together based on their frequency spectra, such that a global time filter setting per group can be recommended.

Figure 13A:
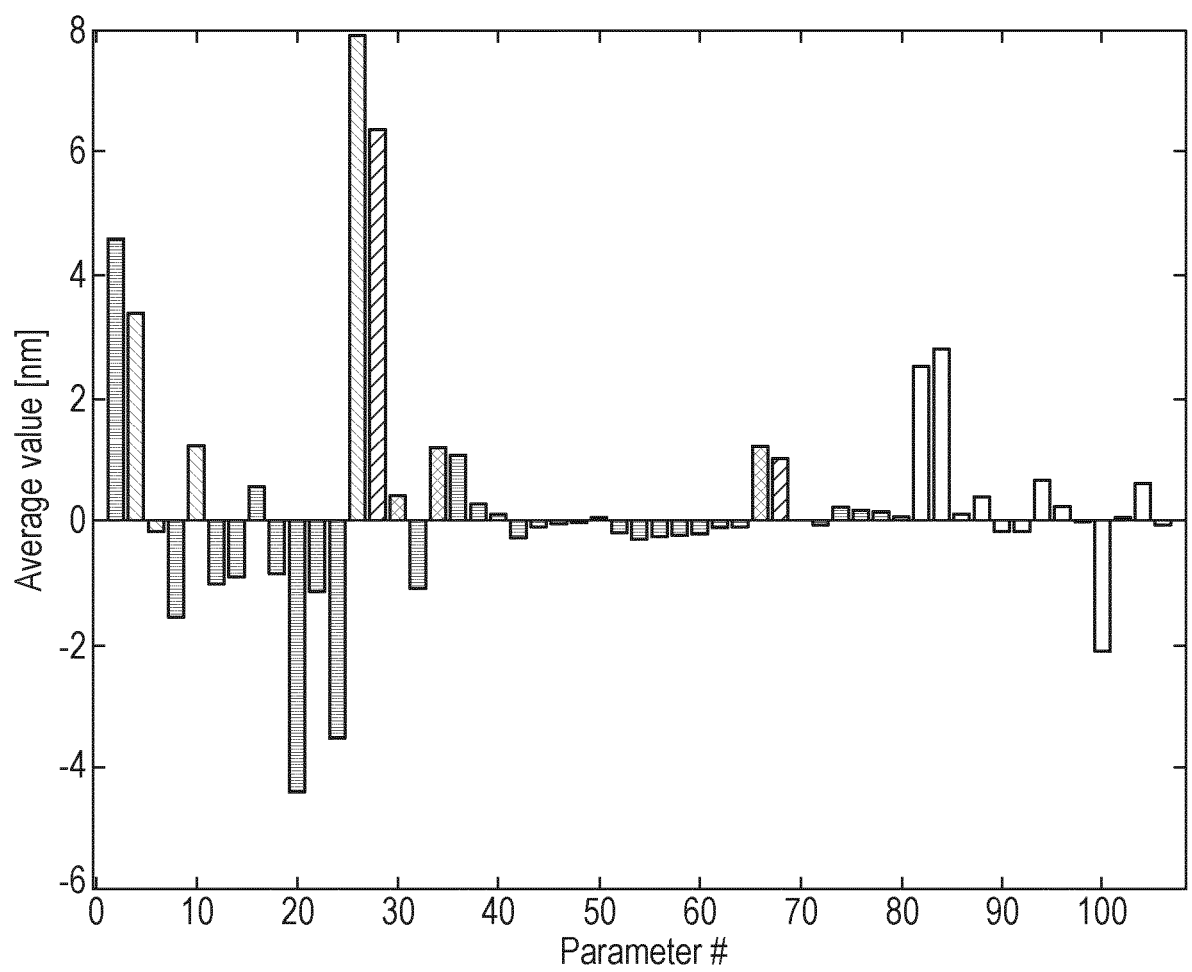
Figure 13D:
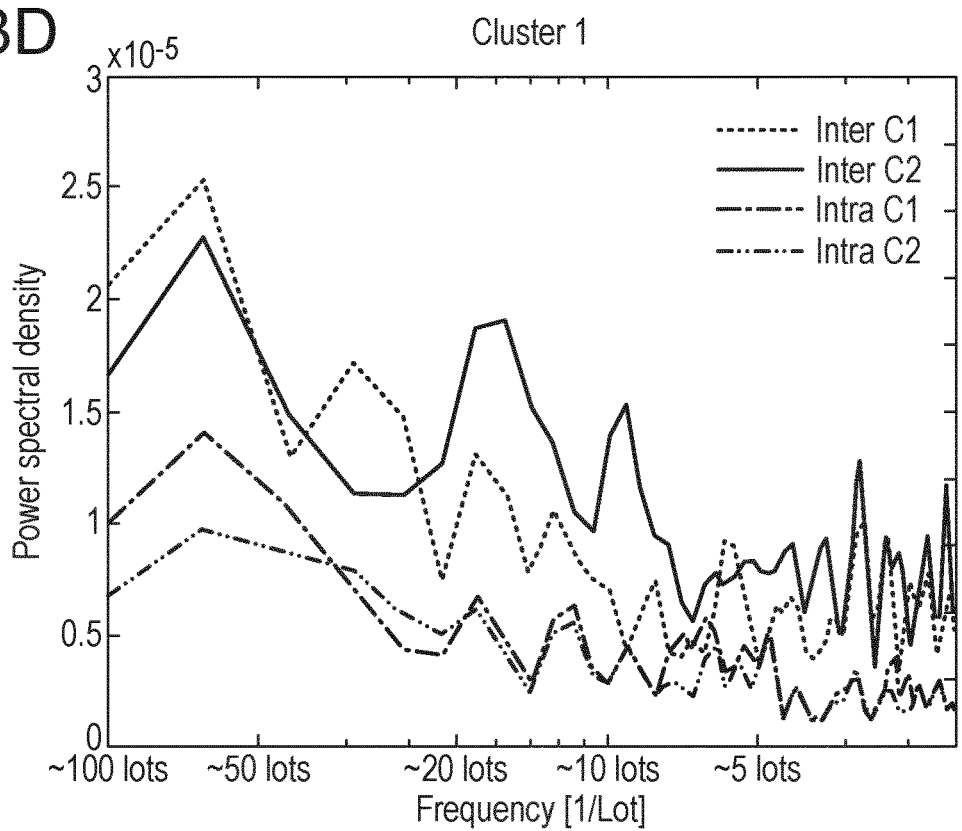
Figure 13E:
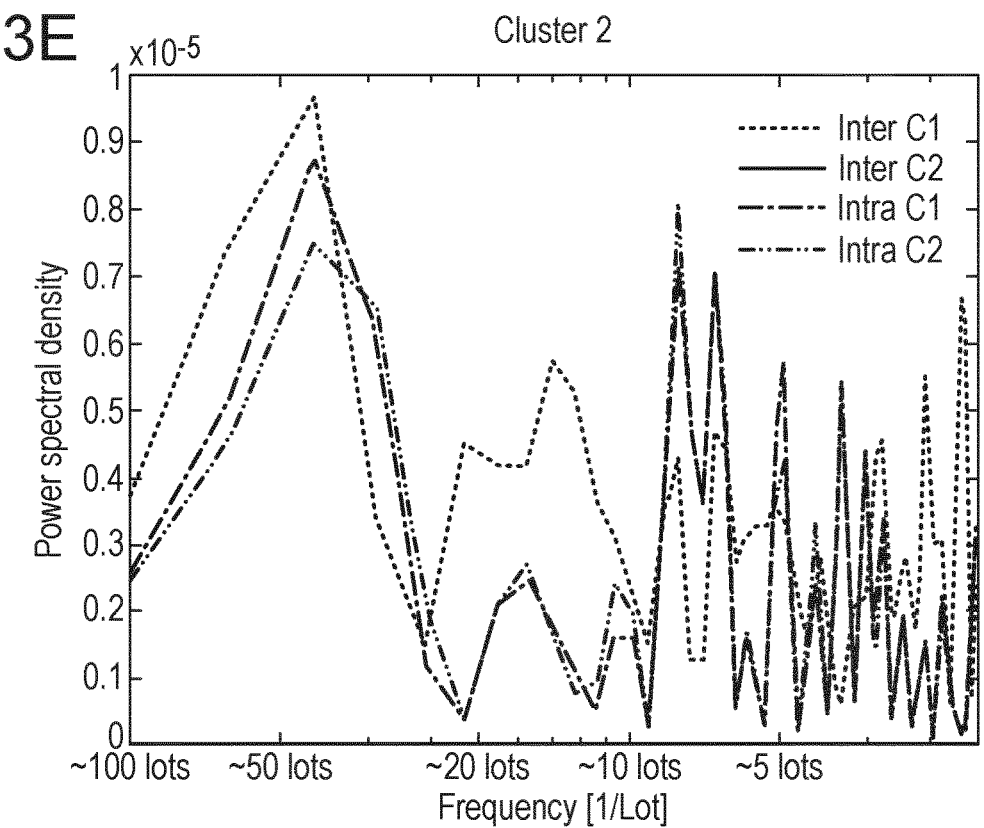
Figure 13F:
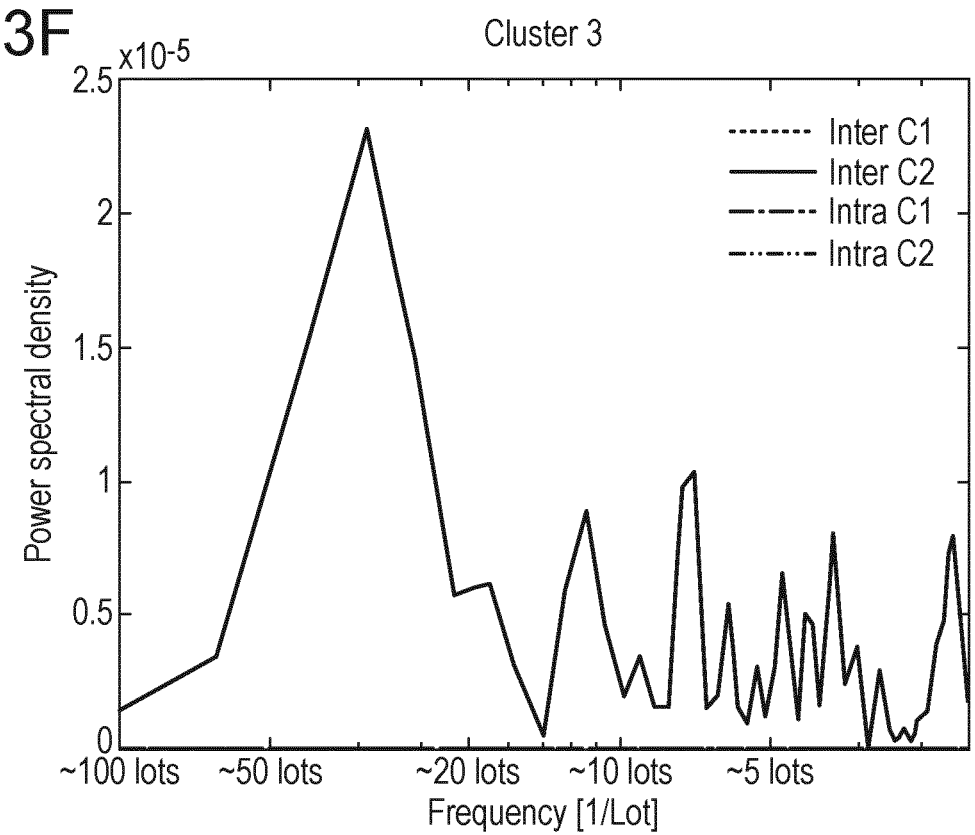
Figure 13G:
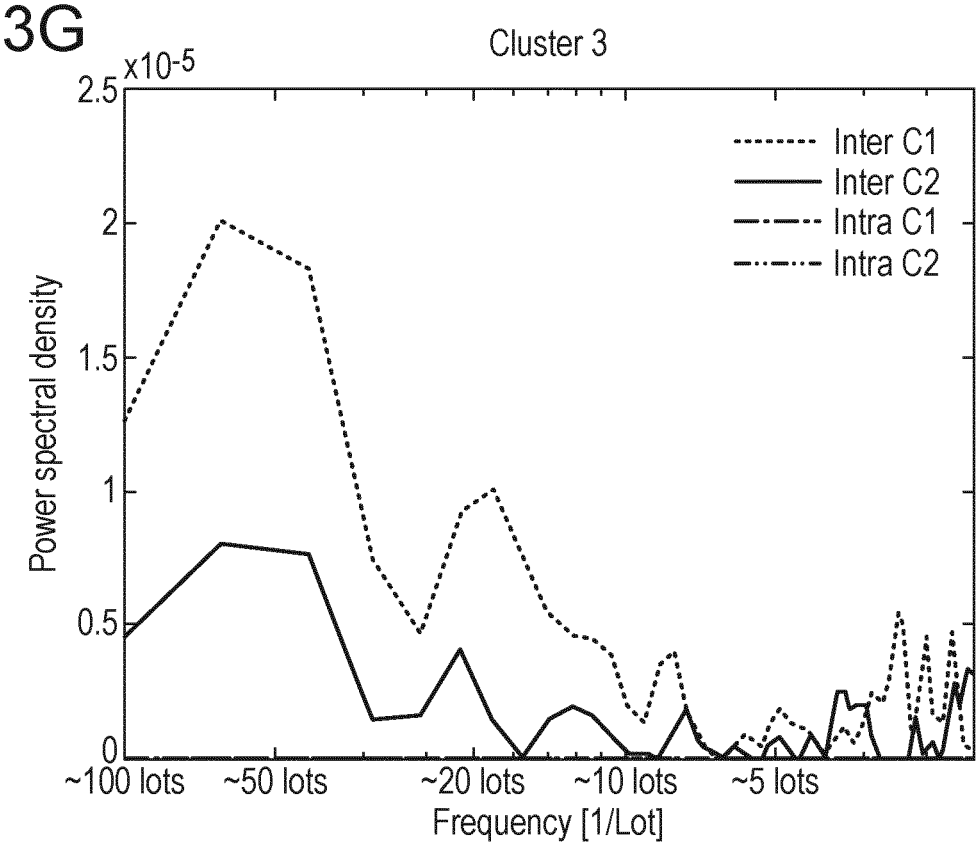
Figure 14A:
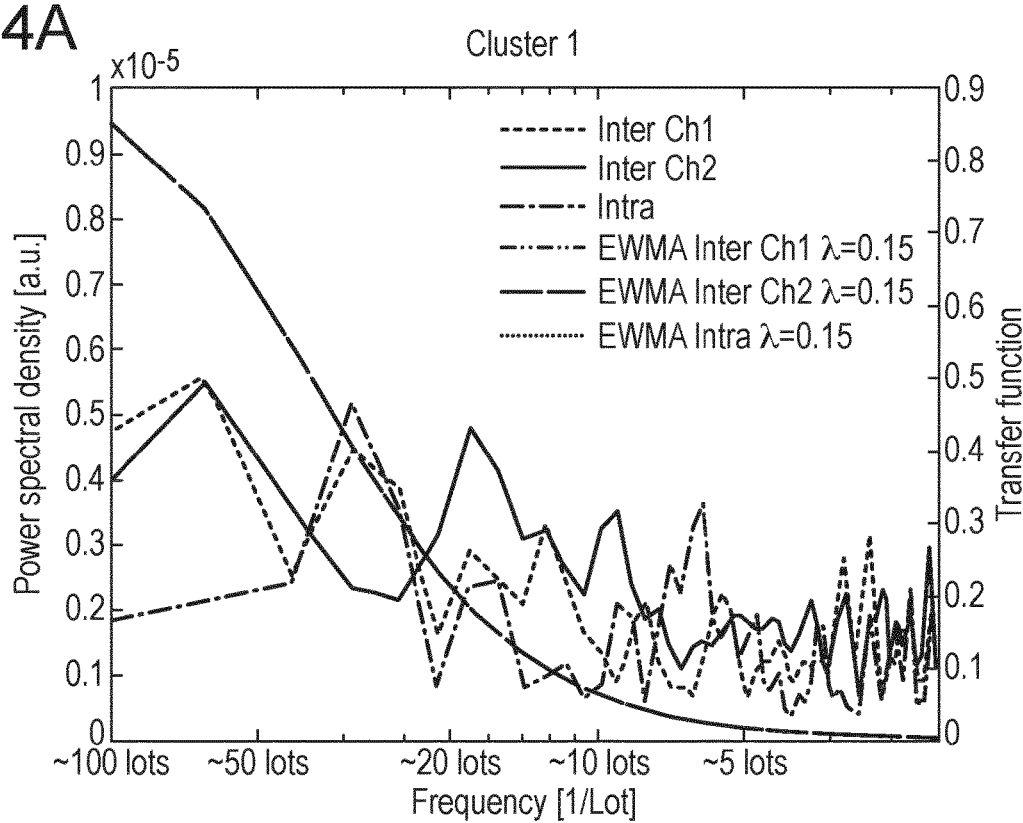
Figure 14B:
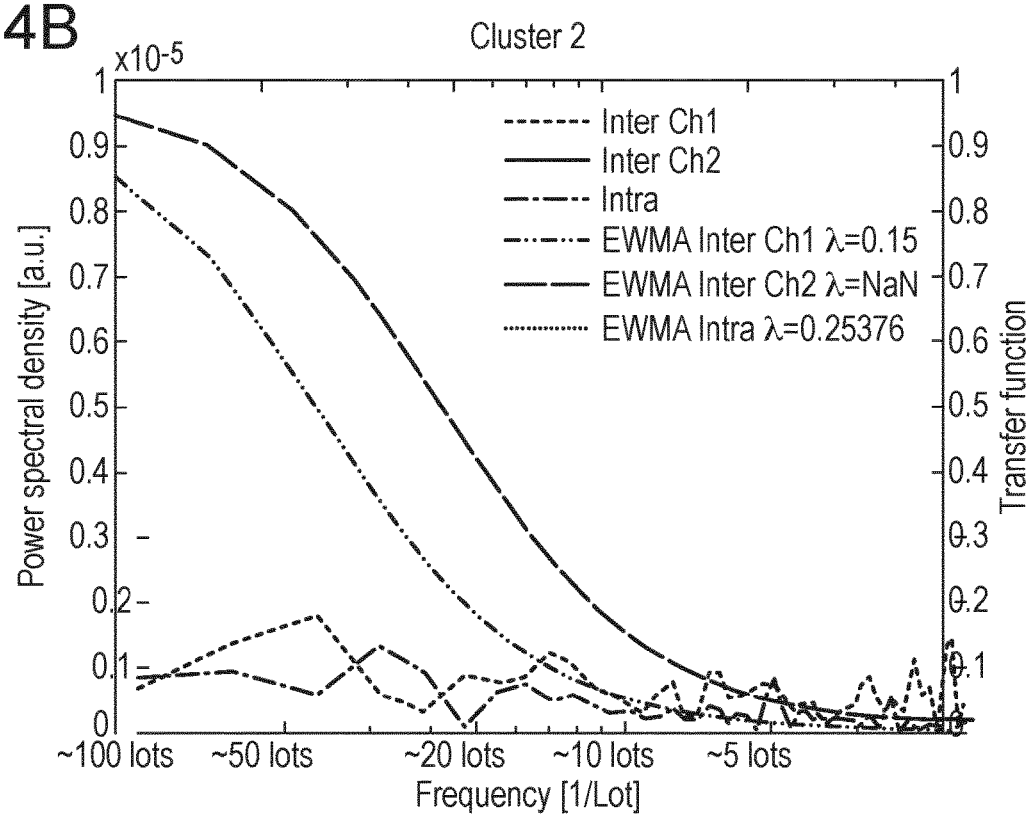
Figure 14C:
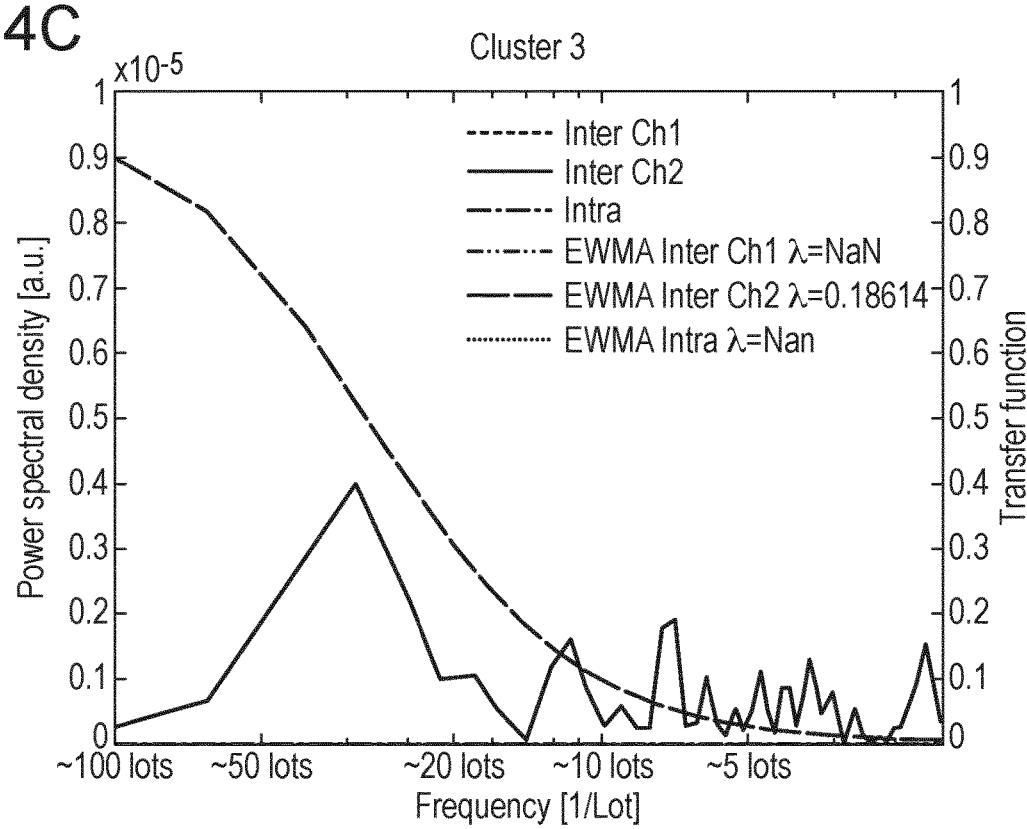
Figure 14D:
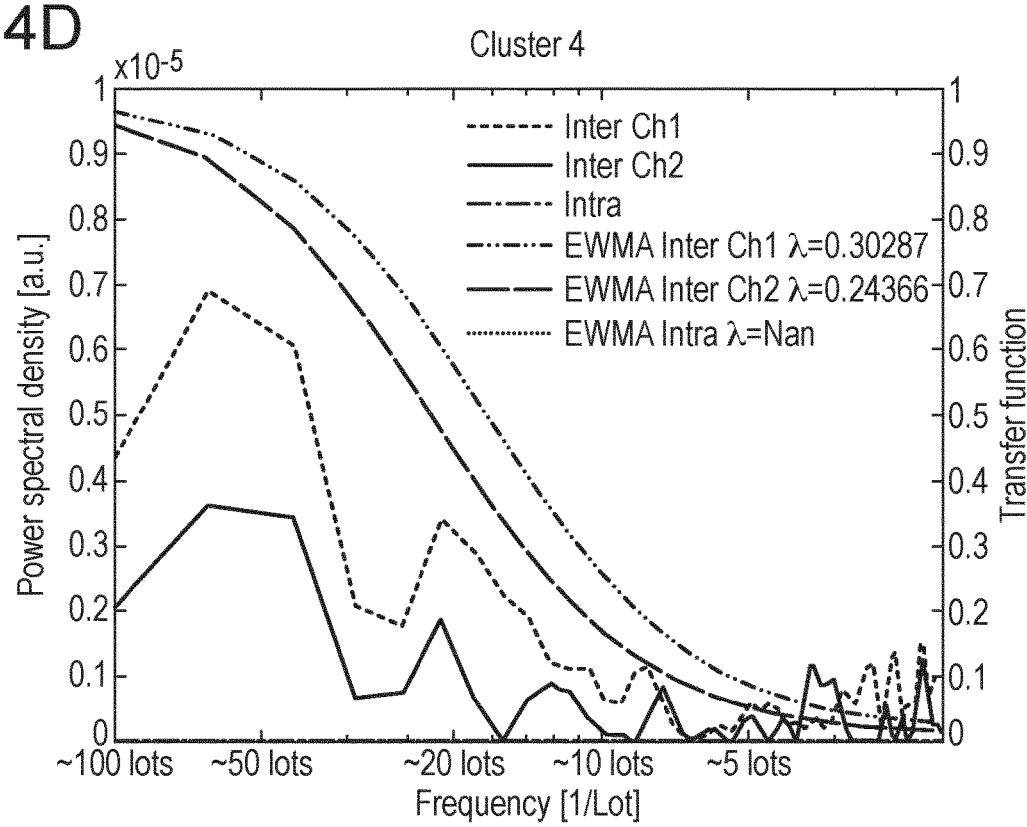

FIGS. 13A to G show grouping of model parameters as a result of first applying PCA to the collection of frequency spectra per contributor. FIG. 13A shows the contribution of each parameter to the average fingerprint. FIGS. 13B and 13C show the location of each model parameter in the space spanned by the first four principal components (i.e. principal frequency spectra). This can then be used to cluster parameters with similar frequency spectra together, as represented by the different shades and indicated in the key. The resulting accumulated frequency spectra for each of parameter clusters 1 to 4 are shown in FIGS. 13D to G.

FIGS. 14A to D show power spectral density as a function of sampling frequency for each of parameter groups (clusters) 1 to 4. The resulting frequency spectra per parameter group (this time accumulated using the total fingerprints on the left via pointwise FFT) are further split into inter and intrafield. Also shown for each group of spectra are the corresponding optimized time filter transfer functions, with the optimized lambda values shown in the legend.

Grouping (or clustering) of parameters can also be used in order to deal with parameters, that are correlated amongst each other, such as intrafield "k"-parameters, representing regular polynomials which are non-orthogonal, by assigning these parameters to the same group.

The above-described approach to determine the "average" aliasing error can be applied to parameter selection or elimination, by comparing the average aliasing error per parameter to the contribution of the parameter to the average fingerprint (see FIG. 13A). If the aliasing error is higher than the actual "useful" contribution, the parameter is to be eliminated.

Figure 5:
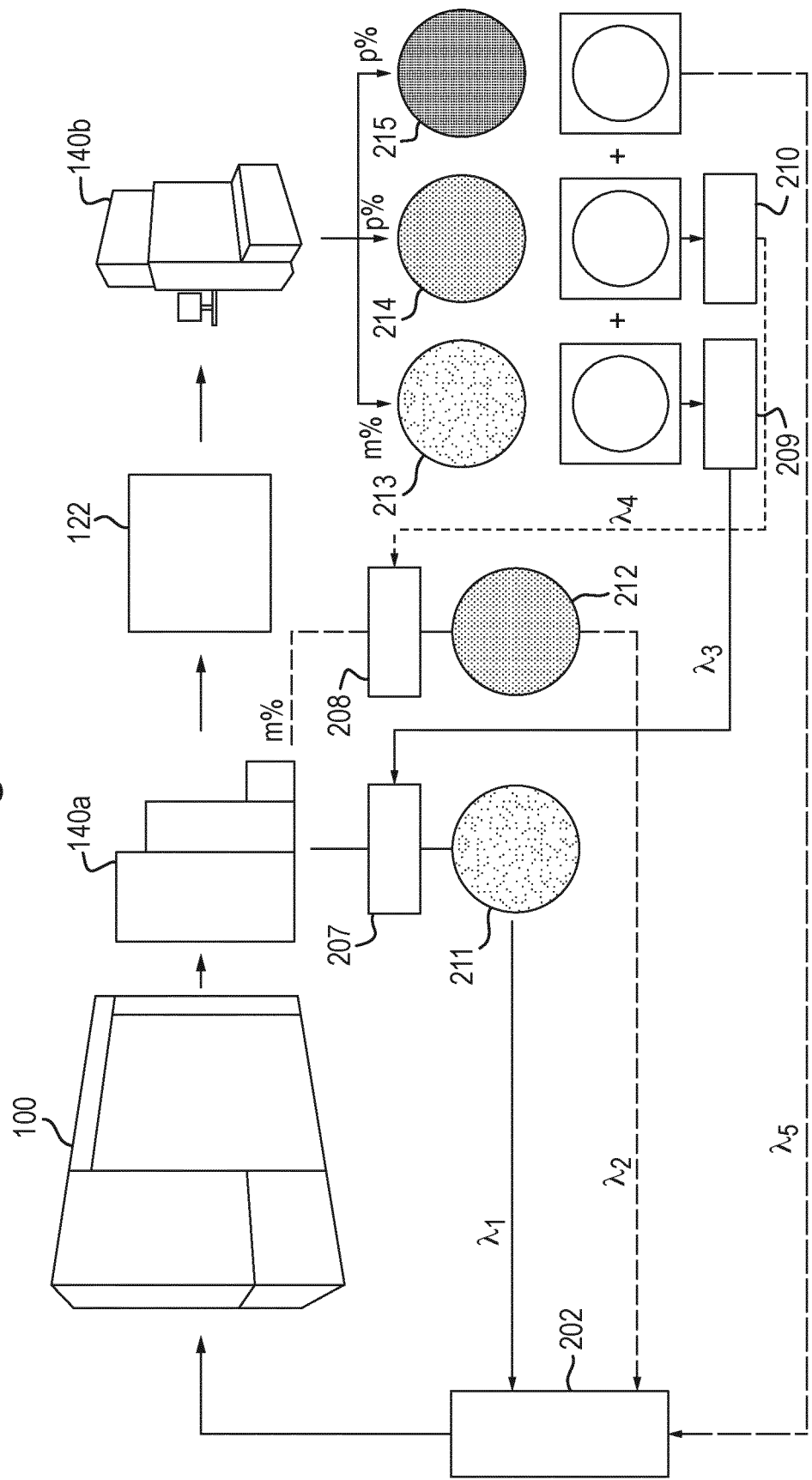
FIG. 5 depicts an automated process control method according to another embodiment of the invention.

Another control system in which the invention can be applied is depicted in FIG. 5. In the drawings, parts that are the same as in the system of FIG. 2 are depicted with the same references and not described further.

In the control scheme of FIG. 5, after development some wafers of each lot are measured with a standard sampling scheme 211 and the measurement results fed back to controller 202 with time constant $\lambda_1$. Another proportion, e.g. n % of lots, are measured with a dense sampling scheme 212 and the measurement results fed back to controller 202 with time constant $\lambda_2$.

After the pattern transfer step (such as an etch), m % of lots are measured with standard sampling scheme 213, p % with dense sampling scheme 214 and q % with hyper-dense sampling scheme 215. The measurement results from sampling scheme 213 are fed back and combined 207 with the results from standard sampling of after-development substrates with time constant $\lambda_3$. The measurement results from dense sampling scheme 214 are fed back and combined 208 with the results from dense sampling of after-development substrates with time constant $\lambda_4$. The measurement results from hyper-dense sampling scheme 215 are fed back to controller 202 with time constant $\lambda_5$. Additional contributors can also be included.

Figure 6:
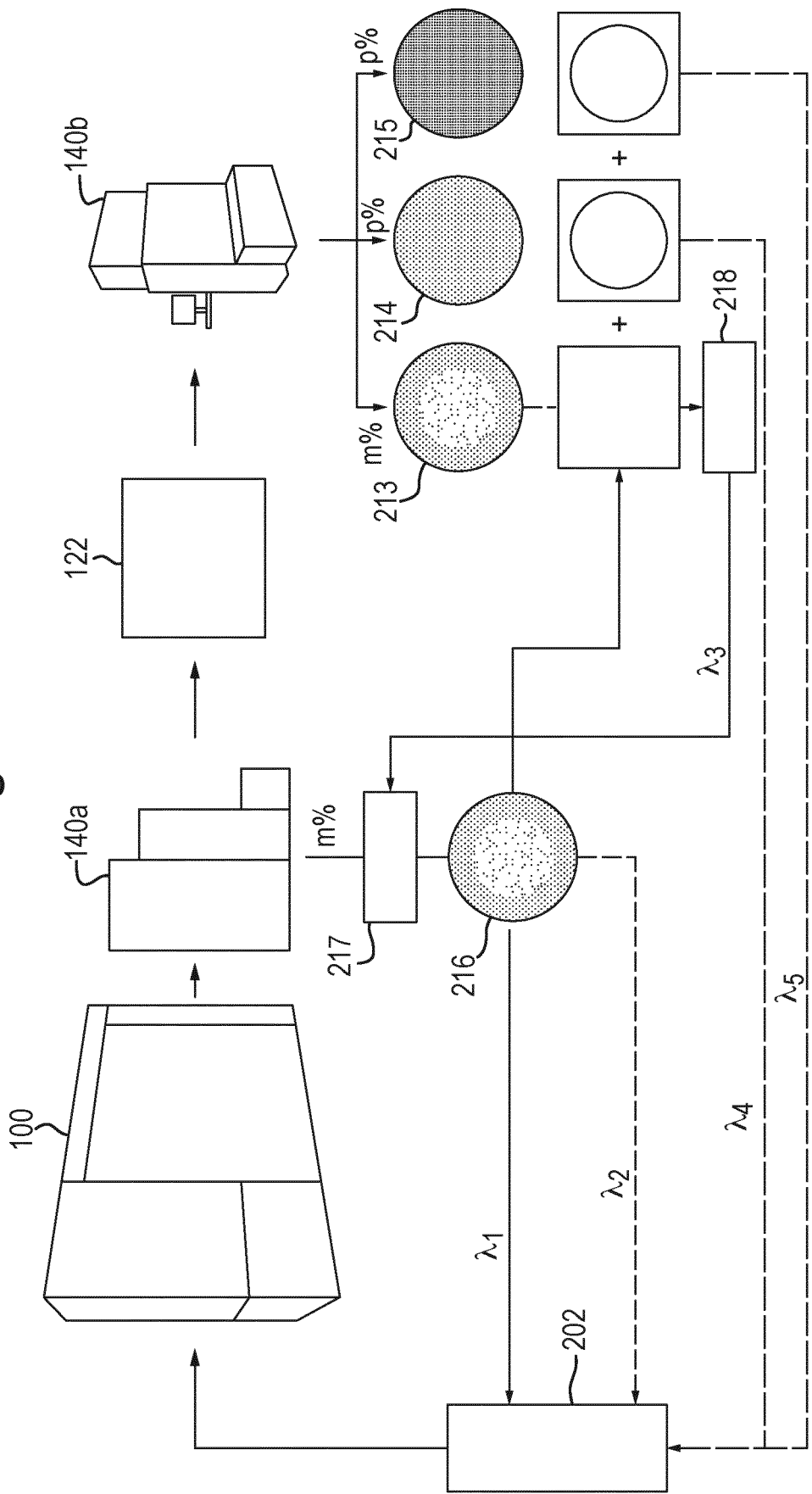
FIG. 6 depicts an automated process control method according to another embodiment of the invention.

Another control system in which the invention can be applied is depicted in FIG. 6. In the drawings, parts that are the same as in the systems of FIGS. 2 and 5 are depicted with the same references and not described further.

In the control scheme of FIG. 6, after development some wafers of each lot are measured with a standard sampling scheme 216 and the measurement results fed back to controller 202 with time constant $\lambda_1$. The same substrates are measured with another sampling scheme 212 and the measurement results fed back to controller 202 with time constant $\lambda_2$. After the pattern transfer step (such as an etch), m % of lots are measured with standard sampling scheme 213, p % with dense sampling scheme 214 and q % with hyper-dense sampling scheme 215. The measurement results from sampling scheme 213 are fed back 218 and combined 207 with the results from standard sampling of after-development substrates with time constant $\lambda_3$. The measurement results from dense sampling scheme 214 are fed back and combined 208 with the results from dense sampling of after-development substrates with time constant $\lambda_4$. The measurement results from hyper-dense sampling scheme 215 are fed back to controller 202 with time constant $\lambda_5$.

It will be appreciated that the invention can be used with other control schemes and variations on these control schemes.

In summary, embodiments of the present invention can enable identification of relevant frequency domains based on available multi lot data. This then enables determination of sampling frequencies and time filter settings in order to accurately capture and correct the correctable variation in the respective frequency domain and avoid penalties introduced by under sampling and/or destructive feedback. KPIs can be setup so as to directly represent the on-product overlay impact of the respective recommended settings. KPIs could also be modified as to represent other metrics relevant to yield such as "number of dies-in-spec".

Embodiments of the invention also provide frequency domain based budget breakdowns to accurately forecast correctable overlay content per after-etch control strategy contributor and per frequency domain, accurately taking into account effects of time filtering and by extension sampling rate, in order to assist selection and control setup of the valid contributors for the after-etch control strategy.

Embodiments of the invention also provide low-cost optimization approaches to customize time filter coefficients according to the frequency content of the variation to be captured/controlled. This approach can be extended to dynamically updating the time filter parameters based on the generated monitoring data in a run-to-run control scenario. In the embodiments described above, filtered measurement data is used to apply corrections to a lithography step. It will be appreciated that corrections can also be applied in other steps of a lithographic process, for example a pattern transfer step such as etching.

Also enabled in embodiments of the invention is the possibility to partially compensate for the detrimental effects of under-sampling (measuring at lower sampling rates) by calculating correctable offsets representing the fingerprints introduced by "aliasing".

Frequency-sensitive sampling point and model parameter selection (including frequency domain based parameter grouping for optimizing time filtering per parameter), as well as co-optimization of sampling density and sampling rate are also achievable in embodiments of the invention.

The present invention enables a control strategy to be built and optimized more quickly than known methods because, generally, frequency domain based calculations are computationally less expensive (O(N log N)) than time-domain computations (O(N²)). This is especially useful for optimization calculations and can enable dynamic, real time updates of time filter parameters.

Control strategies derived using the invention can be more accurate, leading to higher yield. The straightforwardness of the approach helps to produce more accurate recommendations for overlay control loops that translate into improved overlay performance and hence higher yield. Moreover, the generated fingerprints, e.g. describing the effects of under-sampling, might be used to partially compensate for these effects.

Proactive use of the present invention can enable ramp phases to be finished faster (from a control loop point of view), compared to when the required settings are derived reactively, e.g. via statistical process control.

The approaches described above can be extended to or executed on per substrate level, in order to minimize substrate-to-substrate variation concurrently with the lot-to-lot variation.

The present invention provides methods and KPIs to optimize time filter settings and sampling rates. Methods of the invention are based on a frequency domain approach. Desirably, the input data set is representative in terms of variation of the process.

A second aspect of the present invention aims to expand upon and improve the above described embodiments. In particular, embodiments of the second aspect aim to capture and compensate for the interaction of different contributors (ADI, MTD, AE refinement) over time, which is not captured with isolated cost functions per contributor. In addition, embodiments of the second aspect can apply time filtering in a cascaded fashion (as for MTD).

Embodiments of the second aspect may provide more accurate overlay forecast methodologies separating effects that cannot be corrected for by time filtering from effects that can be corrected for by time filtering in a straight-forward manner.

Embodiments of the second aspect also aim to provide an improved initial forecast for 'appropriate' sampling rates based on assessing the temporal autocorrelation of the contributor for which the sampling rates are to be forecast. The second aspect proposes use of metrics other than stacked Mean+3 sigma, for example dies-in-spec. The second aspect also supports collection of ADI and AEI data on different timescales.

Furthermore, although embodiments of the first aspect handle cases where spatial sampling density is kept the same for different sampling rates, in other situations, metrology constraints might demand metrology load to be kept constant or within a certain limit over time. The second aspect therefore enables co-optimizing sampling density both in space and time during temporal advice.

A combined cost function helps to co-optimize all contributors in one go, including potential cross talks between contributors. It can be extended such that the cases, where a time filter on top of another time filter is applied. For example, MTD fingerprints are refreshed with a time filter, then applied to ADI, where they are time filtered again as part of the ADI global loop) as described below and with reference to FIGS. 15 to 17.

A generalized transfer function $H_l$ describing filtering & delay per contributor can be defined as follows (for the example of an EWMA timefilter with parameter $\lambda$):

$$H_l = H_{cum.\ delay,l} \times H_{EWMA,l} \quad (11)$$

$$H_{EWMA,l}(f) = \frac{\lambda_l}{1 - (1 - \lambda_l) \cdot e^{-i2\pi f \epsilon_l}} \quad (12)$$

$$H_{cum.\ delay,l}(f) = e^{-i2\pi f \delta_l} \sum_{\varepsilon=0}^{\epsilon-1} e^{-i2\pi f \varepsilon_l} = e^{-i2\pi f \delta_l} \frac{1 - e^{-i2\pi f \epsilon_l}}{1 - e^{-i2\pi f}} \quad (13)$$

where $\delta$ is the delay between measurement and application and $\varepsilon$ is the sampling lag.

A combined cost function to be minimized is defined as:

$$J(\lambda) = \frac{\left|\sum_l^L (\widehat{A}_l - \hat{B}_l)\right|^2}{\left|\sum_l^L \hat{A}_l\right|^2} = \frac{\sum_{i=1}^{I}\sum_{k=0}^{J-1}\sum_l^L\sum_m^M \left(\hat{A}_{k,i,l}\cdot\hat{A}^*_{k,i,m} - \hat{A}_{k,i,l}H^*_{k,m}\hat{A}^*_{k,i,m,ds} - \hat{A}^*_{k,m}H_{k,l}\hat{A}_{k,i,l,ds} + H_{k,l}H^*_{k,m}\cdot\hat{A}_{k,i,l,ds}\hat{A}^*_{k,i,m,ds}\right)}{\sum_{i=1}^{I}\sum_{k=0}^{J-1}\sum_l^L\sum_m^M \hat{A}_{k,i,l}\hat{A}^*_{k,i,m}} \quad (14)$$

where k to J−1 is the complex value of the discrete Fourier transform at frequency $f_k$, i to I are position indices, and l and m denote the different contributors, respectively. For each contributor l, $\hat{A}_{k,i,l,ds}$ is the down-sampled signal (function of ∈ _l), average removed, and $\hat{A}_{k,i,l}$ is the original signal. One combined cost function for all contributors can serve for multivariate time filter optimization and as KPI for sampling scenario validation. It will include cross terms and/or dependencies between contributors.

The gradient is given by:

Note that the dimensionality is reduced to (1, number of lots) and the following parts can be calculated independently, before optimization:

$\hat{A}_{k,i,l}\cdot\hat{A}^*_{k,i,m}$
$\hat{A}_{k,i,l}\hat{A}^*_{k,i,m,ds}$
$\hat{A}^*_{k,m}\hat{A}_{k,i,l,ds}$
$\hat{A}_{k,i,l,ds}\hat{A}^*_{k,i,m,ds}$
$\hat{A}_{k,i,l}\hat{A}^*_{k,i,m}$ This pre-calculation can reduce the time taken for calculation by between one and two orders of magnitude.

$$\frac{\partial}{\partial \lambda_m}J(\lambda_1, \ldots, \lambda_M) = \frac{\sum_{i=1}^{I}\sum_{k=0}^{J-1}\sum_l^L 2\cdot\mathrm{Re}\left(-\hat{A}_{k,i,l}\frac{\partial H^*_{k,m}}{\partial \lambda_m}\hat{A}^*_{k,i,m,ds} + H_{k,l}\frac{\partial H^*_{k,m}}{\partial \lambda_m}\hat{A}_{k,i,l,ds}\hat{A}^*_{k,i,m,ds}\right)}{\sum_{i=1}^{I}\sum_{k=0}^{J-1}\sum_l^L\sum_m^M \hat{A}_{k,i,l}\hat{A}^*_{k,i,m}} \quad (15)$$

Optimization via gradient descent gives:

$$\lambda_{j,m} = \lambda_{j-1,m} - \alpha\frac{\partial}{\partial \lambda_m}J(\lambda_1, \ldots, \lambda_M) \quad (16)$$

where, for each contributor m, j is the iteration number and α is the learning rate of the gradient descent. The constraints are that $\lambda_{min,m}\leq\lambda\leq\lambda_{max,m}$.

Separating average from varying contributions helps to formulate the overall overlay forecast and break it down into KPIs describing the contribution of the different main effects. This also provides an easier method of deriving the offset fingerprint that maybe used to compensate for aliasing effects when measurement frequencies are reduced.

By breaking down into fingerprints per contributor and calculating per contributor, per wafer holder lot to lot and average fingerprints, calculation of the spectral combination inside the cost function is split from the actual calculation of the cost function (and its gradient). Equation (14) is reduced to:

FIG. 15 is an example of a method using cascaded time filtering for so-called Metrology-To-Device (MTD) offsets. MTD offsets are based on difference between e.g. overlay fingerprints measured after development and after etch, respectively. These MTD offsets are then later on applied to after develop overlay (for example) measured on subsequent lots prior to calculation of the respective after develop corrections, such that these corrections contain the content described by the MTD offsets in order to minimize the after etch overlay in an indirect manner. In this method, time filtering is applied twice, to update the MTD fingerprint and as part of after develop correction generation after applying MTD offsets to after develop inspection (ADI) data.

In FIG. 15, MTD offsets, represented by cross-hatched rectangles, are obtained at a first sampling interval and ADI errors represented by diagonally hatched columns, are obtained at a second sampling interval, shorter than the first sampling interval. The individual MTD offsets are time filtered such as to only include "capturable" lot-to-lot variation. The time-filtered fingerprints are then applied to the ADI measurements obtained on a second sampling interval.

$$J(\lambda) = \frac{\left|\sum_l^L(\widehat{A}_l - \hat{B}_l)\right|^2}{\left|\sum_l^L \hat{A}_l\right|^2} = \frac{\sum_{i=1}^{I}\sum_{k=0}^{J-1}\sum_l^L\sum_m^M \left(\hat{A}_{k,i,l}\cdot\hat{A}^*_{k,i,m} - \hat{A}_{k,i,l}\hat{A}^*_{k,i,m,ds}H^*_{k,m} - \hat{A}^*_{k,m}\hat{A}_{k,i,l,ds}H_{k,l} + H_{k,l}H^*_{k,m}\cdot\hat{A}_{k,i,l,ds}\hat{A}^*_{k,i,m,ds}\right)}{\sum_{i=1}^{I}\sum_{k=0}^{J-1}\sum_l^L\sum_m^M \hat{A}_{k,i,l}\hat{A}^*_{k,i,m}} \quad (17)$$

ADI measurements that fall within one sampling interval of the MTD offset obtain the same MTD offset. However, when the correctable content of the ADI measurements, including the applied MTD offset is determined, this is typically time-filtered again with similar purpose as described before. Hence, MTD offsets are time-filtered twice, once directly and once as part of the ADI based control loop.

The combined effect of the two contributors can be described by multiplication of two transfer functions:

$$H_{MTD,tot} = H_{ADI,gt} \times H_{MTD,update} \tag{18}$$

The cost functions and gradient, given above, are adapted accordingly but the general formula still holds.

FIG. 16 depicts the effects of temporal down sampling, in particular aliasing. The aliasing effect might lead to measurable average content in the resulting corrections, when the sampling rate approaches the fundamental frequency of the variation. As indicated by the upper solid arrow in FIG. 16, if the sampling frequency is the same as the fundamental frequency of a contributor, this manifests as a DC offset. However, as indicated by the dot-chain arrows, a contributor having a lower frequency is correctly represented in the error data.

Since the power spectral density (PSD) approach is only representative for the stacked mean plus 3 sigma lot-to-lot variation if the average is removed, the aliasing induced average contribution (i.e. the average of the down sampled variation) needs to be removed from the down sampled data before calculating the PSD. It can be added back later when building up the OV contribution budget. The effect will depend also on which lots are being sampled therefore it is desirable to simulate different scenarios and then calculate confidence intervals.

FIG. 17 depicts the principles of noise propagation through modelling. Modelling reduces the noise intrinsic to the input data by approximating the underlying relationship between neighbouring sampling points through a parameterized model function. This resulting noise (or uncertainty) in the model parameters is typically less than the noise in the input data. The ratio of noise in the model parameters to noise in the input data is described by the normalised model uncertainty (nMU), which is typically <1. Since the cost function (17) essentially represents an extension of the concept of noise propagation, where the denominator represent the intrinsic noise (actually the variance) in the reference measurements and the numerator represents the resulting noise as consequence of the feedback loop, it can be defined as temporal nMU squared, which is given by:

$$J = \frac{\sigma^2_{L2L_{feedback}}(H(\lambda_i, \delta_i, \in_i, f), PSD_{i,ds}(\in_i, f), PSD_i(f))}{\sigma^2_{L2L_{intrinsic}}} \tag{19}$$

where $H(\lambda_i, \delta_i, \in_i, f)$ is the time filter setting, $\delta_i$ is the delay per contributor i, $\in_i$ is the sampling lag per contributor and f is frequency.

It is thus possible to calculate the total variance of the overlay over all lots from a pointwise overlay distribution:

$$\sigma^2_{tot} = \sum_i \sum_j \frac{(\bar{x} - x_{ij})^2}{IJ - 1} \tag{20}$$

$$= \sum_i \sum_j \frac{(\bar{x} - \bar{x}_i - \tilde{x}_{ij})^2}{IJ - 1}$$

$$= \sum_i \sum_j \frac{(\bar{x} - \bar{x}_i)^2 - 2(\bar{x} - \bar{x}_i)\tilde{x}_{ij} + \tilde{x}_{ij}^2}{IJ - 1}$$

$$= \sigma^2_{mean} \cdot \frac{(I-1)J}{IJ-1} + 0 + \sigma^2_{L2L}$$

where $\bar{x}$ is the average overlay, for example, over all locations and lots, $\bar{x}_l$ is the average overlay, for example, over all lots per location, $\tilde{x}_{ij}$ is the overlay, for example, per location per lot with average removed and will sum to zero over all data points, $\sigma^2_{mean}$ includes the error of average (per chuck) residuals and the effect of DC aliasing, $IJ-1\sim 1$ and $\sigma^2_{L2L}$ is the lot-to-lot effect caused by the feedback loop including time filtering and delay as provided by the temporal nMU.

The stacked |mean|+3 sigma overlay can then be calculated as:

$$|mean|+3\sigma = |\bar{x}|+3\sqrt{(\sigma^2_{mean} + \sigma^2_{L2L})} \tag{21}$$

where $|\bar{x}|$ is the mean of the average (per chuck) contribution (translation error) and should be close to zero.

The stacked overlay includes three contributors: residual translation $|\bar{x}|$, average capture error ("aliasing" DC, mean overlay of down-sampled signal) and a feedback loop (lot-to-lot overlay after application of transfer function).

These contributors are shown in FIG. 18 where the total overlay (top left) is shown to be the sum of the average translation error (top right) and the square root of the sum of the average 3-sigma error squared and the lot-to-lot 3-sigma error squared. Both the average translation and average 3-sigma error are a results of two effects. Firstly the correction models may not describe the full fingerprint (i.e. the model residuals not being zero) and secondly the average being incorrectly determined due to "aliasing" happening at higher sampling lags. The lot-to-lot 3-sigma error describes the contribution of the feedback loop in reducing or amplifying the lot-to-lot variation intrinsic to the process to be controlled. All three effects are schematically depicted on the right side of the upper row. The average 3-sigma error shows an sudden increase at sampling lags beyond 11 lots which is associated with an average error fingerprint resulting from aliasing at high sampling lags. The lot-to-lot 3-sigma error can be affected by constraints applied to the time-filter parameter optimization such as to allow to compare the results to run-2-run simulations. For this comparison it needs to be considered, that time-filters need a certain number of lots to converge to their setpoint, which might exceed the number of datasets available for higher sampling lags, as schematically depicted in the graph to the right of the bottom row.

For a cost function combining all contributors, the lambda for different contributors still behave independently. In an example dataset, the optimal ADI lambda was constant when sampled every lot. MTD and AEI lambda vary according to the sampling lag due to the lower lambda threshold required to being able to compare run-to-run simulation and temporal advice results after 15 lots.

The set-up is able to follow the trend in simulation as shown in FIG. 19. In general, the run-to-run simulation trend is underestimated by the setup, since the substrate-to-substrate variation is not included. The delta becomes smaller with increasing sampling lag.

A complementary approach using the auto-correlation function, specifically the sampling rate/lag where it reaches zero is shown in FIGS. 20 and 21. The first root of the auto-correlation function corresponds to the critical sampling rate, where non-correctable aliasing effects start affecting the overlay performance. This does not indicate however the severity of the expected overlay impact, and an overlay forecast breakdown as described above will still be required to select the right sampling rates.

FIG. 20 depicts at the top the frequency spectrum (power spectral density) as a function of sampling frequency (1/lot) in arbitrary units of three different contributors to overlay: the solid line is the ADI global contribution, the dotted line is the after etch refinement contribution and the dashed line is the MTD contribution for the sample dataset referred to above. As indicated by the vertical lines of the respective type there is a change in behavior when the sampling rate divided by 2 approaches the fundamental frequency of the respective contributor. The effect of this can be seen in the lower graph which depicts the temporal auto-correlation function (in arbitrary units) as a function of sample lag. The cross-hatched area indicates low sampling lags that may be limited by metrology constraints and might thus not be so useful. The diagonal hatched areas indicates the regions at high sample lags where the auto-correlation function drops below zero so that the sampled data no longer follows the underlying signal. The unshaded area therefore indicates a range of useful sample lags, which might be included in the subsequent temporal advice and overlay forecast. The nature of lot-to-lot variation (e.g. low frequency drift or wideband noise) determines the potential sampling rate regime.

The relationship between power spectral density and the auto-correlation function is further illustrated in FIG. 21 which derives from the same example dataset. FIG. 21 shows at top the power spectral density as a function of frequency (1/Lot) for MTD and refinement error data and at bottom the corresponding auto-correlation functions. Any component of a chuck average aliasing effect that is not correctable by time-filtering is carried by the relationship between sampling rate and the main peak of the spectrum. Too much overlap will cause aliasing to "fold back" content at sampling rate to average. This effect starts when the sampling rate comes close to the main peak of the power spectral density. The main peak of the power spectral density corresponds to the sample lag, at which the auto-correlation function drops below 0. This effect can be used to limit the region of interest of sampling lags ("scenarios") for KPI calculations, to save computational cost.

However, the value of the autocorrelation function in the limited region is not sufficient for temporal advice, since it does not provide information about the magnitude and overlay performance impact of the DC aliasing. Also, a limited region does not cover the dynamic (lot-to-lot) part, especially concerning the impact of time filtering.

In an embodiment of the second aspect, the methodology is extended to dies-in spec (DIS), by modifying the cost function using weights representing the locations on the substrate that most affect die yield and providing a dies-in-spec forecast methodology analogous to the overlay forecast.

If overlay is expressed as a vector for each of a plurality of positions in each die, then for each die, die yield will be determined by the largest vector in the die:

$$OV_{max} = \max_{Die}(|OV_i|) \tag{22}$$

so that the dies is in spec if $OV_{max} < OV_{thresh}$ and out of spec if $OV_{max} > OV_{thresh}$ is typically of the order of magnitude of stacked m3s spec e.minus ~0.5 nm. The metric dies-in-spec can therefore be advantageous as a metric that represents or forecasts device yield better than the stacked m3s.

If dies-in-spec is used as a metric for yield optimization, the cost function can be modified as follows:

$$J(\lambda) = \frac{\left|\sum_{l}^{L}(\widehat{A}_l - \widehat{B}_l)\right|^2}{\left|\sum_{l}^{L}\widehat{A}_l\right|^2} = \frac{\sum_{i=1}^{I} w_i \sum_{k=0}^{J-1} \sum_{l}^{L} \sum_{m}^{M} (\widehat{A}_{k,i,l} \cdot \widehat{A}^*_{k,i,m} - \widehat{A}_{k,i,l} H^*_{k,m} \widehat{A}^*_{k,i,m,ds} - \widehat{A}^*_{k,m} H_{k,l} \widehat{A}_{k,i,l,ds} + H_{k,l} H^*_{k,m} \cdot \widehat{A}_{k,i,l,ds} \widehat{A}^*_{k,i,m,ds})}{\sum_{i=1}^{I} \sum_{k=0}^{J-1} \sum_{l}^{L} \sum_{m}^{M} \widehat{A}_{k,i,l} \widehat{A}^*_{k,i,m}} \tag{23}$$

where k to J−1 is the complex value of the discrete Fourier transform at frequency $f_k$, i to I are position indices, and l and m denote the different contributors, respectively. The nature of the cost function remains unchanged, however, the weighting $w_i$ of individual locations on the substrate is adapted such that overlay is optimized for the position most relevant to die yield. Relevant positions on the wafers are the ones for which:

in the best case, the die to which the position corresponds yields in the worst case, the die to which the position corresponds does not yield.

Under these conditions, control loop optimization can be more effective towards maximizing the device yield.

Thus, the weights $w_i$ can be defined as:

$$w_i = p_{yield,best\ case} \times p_{no\ yield,worst\ case}, \tag{24}$$

with $p_{yield}$ ... and $p_{noyield}$ ... as the probabilities corresponding to the above cases.

The computation flow follows these steps:
1. Per chuck, calculate average and lot-to-lot variation for all contributors, including residuals.
2. Assign measured marks to dies according to layout, and remove incomplete dies.
3. Calculate per die the max overlay per lot and the empirical cumulative distribution function (ecdf) of this overlay based on:
   Average and lot-to-lot residuals (best case), assuming minimum overlay is achieved when all average and lot-to-lot-CE overlay is corrected by control loop.
   Average and lot-to-lot residuals plus 2×lot-to-lot correctables of all contributors (worst case) assuming maximum overlay is achieved, when lot-to-lot-CE overlay is amplified by control loop to maximum factor (×2). Average correctables are assumed to be captured by control loop regardless of settings.
4. From ecdf, calculate cumulative percentages of "lots" yielding or non-yielding.
5. Assign percentages to all marks in die: if a mark corresponds to multiple dies, take maximum percentage over all assigned dies.

Weights are mostly high at the substrate (e.g. wafer) edge, where high lot-to-lot variation leads to substantial changes in local overlay, and hence die yield. However, overall spectrum and temporal advice are minimally affected by the corresponding weights. This is because points with small lot-to-lot variation will already contribute little to nothing in overall average PSD, therefore this is already taken account of in the original cost function.

The dies-in-spec forecast as a function of the sampling rates and time filter settings can be derived from the combined, un-modified cost function as shown in (14). Using dies-in-spec as a KPI, the cost function needs to be evaluated pointwise for determining the DIS forecast.

The computational flow to forecast dies-in-spec is as follows:

1. Calculate position-wise average residuals (per chuck)
2. Per position, calculate pointwise overlay $\sigma_{L2L}$ forecast from minimized total cost function.
3. Add in quadratically the $\sigma_{W2W}$ of the substrate-to-substrate overlay variation
4. Calculate normal distribution function using results of 1 and 2+3 for mean and sigma values, respectively.
5. From 4, calculate chance of percentage per target position, that OV at the position will exceed OV threshold.
6. Chance of die yielding $$P_{yield,j} = \Pi_{i \, in \, die \, j} P_{yield,i,j} \quad (25)$$

7. Overall % of dies-in-spec:

$$P_{dies-in-spec} = \frac{\sum_{j=dies} P_{yield,j}}{n_{dies}} \quad (26)$$

Results indicate that optimum time-filter settings as predicted by cost function seems to indeed also deliver more dies in spec. Simulated results match forecast in an example.

Comparing stacked mean+3σ and dies-in-spec metrics, similar trends were observed in the example dataset as shown in FIG. 23. FIG. 23 compares a total overlay forecast using a mean 3-sigma error (top) with a dies-in-spec forecast. It can be seen that both metrics exhibit consistent behaviour with respect to different combinations of sampling lags for ADI global, MTD global and ACI refinement, represented by triplets of numbers on the x-axis (the second plot omits the sampling lag for ADI global, which is assumed to be 1). That means, while the stacked m3s increases with increasing sampling lags, the dies-in-spec decrease since less dies are yielding at larger overlay. Both figures compare the forecasts calculated by the methods described in the previous paragraphs to run-to-run simulations on the same data set, indicating in general the values obtained in these run-to-run simulations follow the trend of the forecasts. Furthermore, the top figure also displays the resulting optimized time-filter parameters λ per contributor for each of the displayed sampling lag combinations. The dies-in-spec metric was not influenced much by the sampling rate, but generally follows the trend of the stacked m3s. This is due to the seemingly stable process and low overall overlay.

FIG. 24 illustrates an example of a data collection strategy determined using an embodiment of the invention. In this example, after development inspection (ADI) data is obtained every lot of four substrates (wafers) using a sparse spatial measurement pattern. Every second lot, ADI data is obtained using a first dense spatial measurement pattern. AEI data is obtained every second lot using a second dense spatial measurement pattern, denser than the first dense spatial measurement pattern. This data collection strategy can be continued for several weeks of production, e.g. 8 to 12 weeks.

Where data is collected on different timescales, as in the above data collection strategy, the basic workflow for obtaining a metrology strategy is modified to include a step of interpolation, e.g. Fourier interpolation including zero padding in the frequency domain and scaling. Fourier interpolation may be performed using an FFT. Then temporal advice can be executed using non-interpolated spectrum for correlation length and per substrate holder residuals based on non-interpolated data. Temporal KPI breakdown based on interpolated data can be determined using the same functions.

The methodology can be realized by employing 'Fourier' interpolation, in order to 'fill in the gaps' of the more sparsely collected data such that its (known) frequency characteristics remain unaffected. This is shown in FIG. 25 which depicts the power spectral density data as a function of frequency (top) transformed using an inverse FFT to generate the auto-correlation function (bottom) in terms of sample lag. The frequency spectra are shown in the top graph for three cases: 1. if the full data set is used (no measurements "missing") (solid line); 2. if only every second lot is measured (dotted line); and 3. if only every second lot is measured, but the missing lot data is obtained by Fourier interpolation (dashed line). As can be seen, the three spectra are similar in shape except for a scaling factor due to the different number of actual lots used for calculation. The corresponding autocorrelation functions (using corresponding line types) are shown in the graph below, which were obtained by inverse FFT. The functions look similar for case 1 and 2, especially with respect to the sample lag for which the ACF (auto correlation function) drops below zero, which can be used as an indicator for useful sampling lags as described above. In case 3, the interpolation causes artifacts in the autocorrelation function due to the zeros padded in the frequency domain. Hence it can be concluded, that for pre-excluding certain sampling lags via ACF, the non-interpolated signal must be used. However, for the actual temporal advice and overlay forecast, Fourier interpolation can help to produce similar results on less frequently measured data as shown in FIG. 26.

In some cases there may be a mismatch in temporal frequency between initial data used to establish a metrology strategy and feedback loop and data obtained during high volume manufacture. This is because initial data might be obtained in ramp up at a relatively low temporal frequency because only a few lots are exposed at a time. During high volume manufacture, more lots are exposed in each interval, impacting the characteristics of the feedback loop. In effect, time-dependent process variations are sampled at a higher frequency. This can be addressed by scaling the frequency f in the transfer function:

$$H_l = H_{cum. \, delay,l} \times H_{EWMA,l} \quad (24)$$

$$H_{EWMA,l}(f) = \frac{\lambda_l}{1 - (1 - \lambda_l) \cdot e^{-i2\pi f \epsilon_l}} \quad (25)$$

$$H_{cum. \, delay,l}(f) = e^{-i2\pi f \delta_l} \sum_{\varepsilon=0}^{\epsilon-1} e^{-i2\pi f \epsilon_l} = e^{-i2\pi f \delta_l} \frac{1 - e^{-i2\pi f \epsilon_l}}{1 - e^{-i2\pi f}} \quad (26)$$

Alternatively a Fourier interpolation technique as described above can be used.

Also frequency scaling can be employed to compensate for differences in throughput between setup and run-to-run. Lastly, determining the cross-spectral terms in the cost function using the time domain cross correlation approach will make the method also work for (temporarily) irregularly spaced data. Such a cost function can be set out as below:

$$J(\lambda) = \frac{\left|\sum_{l}^{L}(\widetilde{A}_l - \widehat{B}_l)\right|^2}{\left|\sum_{l}^{L}\hat{A}_l\right|^2} = \frac{\sum_{i=1}^{I}\sum_{k=0}^{J-1}\sum_{l}^{L}\sum_{m}^{M}(\hat{A}_{k,i,l}\cdot\hat{A}^*_{k,i,m} - \hat{A}_{k,i,l}\hat{A}^*_{k,i,m,ds}H^*_{k,m} - \hat{A}^*_{k,m}\hat{A}_{k,i,l,ds}H_{k,l} + H_{k,l}H^*_{k,m}\cdot\hat{A}_{k,i,l,ds}\hat{A}^*_{k,i,m,ds})}{\sum_{i=1}^{I}\sum_{k=0}^{J-1}\sum_{l}^{L}\sum_{m}^{M}\hat{A}_{k,i,l}\hat{A}^*_{k,i,m}} \quad (27)$$

The product of spectra of contributors per position/parameter can be deduced for cross correlation function of original time series via Fourier transform:

$$\hat{A}_{k,i,l'}\hat{A}^*_{k,i,m} = FT(\text{crosscor}(\hat{A}_{t,i,l},\hat{A}^*_{t,i,m})) \quad (28)$$

The cross correlation can also be determined for irregular spaced time series as a regular function through overlap of the entire time series with regular steps.

A methodology strategy determined according to an embodiment can be extended to handle cases, where the spatial sampling density depends on the sampling rate, and can be even utilized with intra-lot distributed sampling. FIG. 27 compares after development (ADI, solid line) and after etch (AEI, dashed line) power spectral density and autocorrelation functions for the same example dataset as before. It will be seen that the auto-correlation function drops below 0 for a sampling lag of greater than or equal to 8 lots. It is therefore desirable in this case to keep the sampling lag below 8 lots, i.e. to set a lower limit for the sampling frequency.

FIG. 28 illustrates a strategy to keep the metrology load constant: spatial sampling density and temporal sampling intervals are modified together. For example, the left side of the figure illustrates an arrangement with 25 measurement points per field (ppf) and a sampling lag of 4 lots. The 25 ppf may be measured on every fourth lot or distributed across 4 lots as depicted at the bottom. The central section illustrates 39 ppf and a lag of 6 lots (measured on every sixth lot or across 6 lots) and the right section illustrates 49 ppf with a lag of 8 lots (measured on every eighth lot or across 8 lots).

FIG. 29 depicts total overlay forecast and its breakdown into the different components similarly to FIG. 26, comparing the effect of different sampling densities and also the way these sampling densities are obtained, either via measuring the complete sampling scheme exclusively at each respective multiple of the sampling lag, or by distributing the sampling over a number of lots equivalent to the respective sampling lag. The overlay forecast shows that in general 19 parameters per field modelling gives better results (lower overlay forecast) than 38 parameters per field modelling at lower sampling lags, whereas 38 parameters per field modelling if combined with distributed samplings provides the best performance for a sampling lag/distribution length of 8 lots. The breakdown shows that this is due to the better capture of the average fingerprint using this configuration.

The above described methodologies can be put into effect in a manufacturing method depicted at a high level in FIGS. 30 and 31 and in more detail in FIG. 32. As depicted in FIG. 31, substrates in lots are exposed by lithographic apparatus 100 and measured by a metrology device 140 after a delay of x lots. Corrections feedback to the exposure of lot n+x are determined as a function of the measurements (or the corrections implied to be desirable by such measurements) made on lots n+x, n+x−1, etc., with time-filtering effected by the function. FIG. 32 depicts the method to determine a desirable metrology scheme and time-filter function. First, a plurality of different scenarios are defined. Each scenario defines a set of sampling schemes and rates for each contributor and may take into account metrology constraints. Secondly, time filter optimization is carried out as described above with the aim of minimizing lot-to lot variation and using a combined cost function for all contributors. Finally, this results in a set of overlay forecast and KPIs for each scenario, allowing selection of a desirable scenario. The overlay forecast may include a breakdown into static (aliasing) and dynamic (feedback effects).

FIG. 32 gives more detail. Firstly, step S401, the various available measurement sources are established, e.g. ADI, AEI, experimental data, and example metrology plans are obtained. Step S402 comprises data association and filtering. In step S403 down-sampling and fingerprint decomposition are performed leading to average lot-to-lot breakdown Step S404. Optionally a dynamic budget breakdown can be calculated S405 and, if required Fourier Interpolation is performed S406. The data is then transformed for each contributor to the frequency domain S407. Optionally the autocorrelation length can be calculated in S408 (if desired), in order to predetermine/limit the valid scenarios S409. An iteration engine takes a selection (e.g. based on user preference) of the valid scenarios and any user constraints and optimizes S410 the cost function to obtain KPI budgets and overlay forecasts for each scenario. The results can be visualized S411 to allow the user to select a strategy for use.

The temporal advice methodology plus main improvements have been validated using run-to-run simulations to good correspondence. Even on relatively stable layers such as DRAM wordline, improvement can be up to 0.3 nm, at realistic metrology loads. In other words, the full dynamic control potential can be harvested.

Embodiments of the invention can employ a wide variety of time filters, for example:
  Bessel filters
  Butterworth filters
  Matched filters
  Elliptical filters (Cauer filters)
  Linkwitz-Riley filters
  Chebyshev filters
  Biquad filters
  High-pass filters
  Low-pass filters
  Band-pass filters
  Infinite impulse response filters
  Finite impulse response filters
  Bilinear transforms
  Kalman filters
  Savitzky-Golay filters It is also possible to use multiple filters in series or in parallel to filter inputs for a single controllable process parameter. In an embodiments, a first filter is applied to measurement data of the measurement data time series relating to a first zone of the substrates and a second filter, different from the first filter, is applied to measurement data of the measurement data time series relating to a second zone of the substrates. For example, measurement data relating to edge dies can be treated differently than measurement date relating to interior dies.

Further embodiments of the invention are disclosed in the list of numbered clauses below:

1. A method for generating a control scheme for a device manufacturing process, the method comprising:
    obtaining a measurement data time series of a plurality of substrates on which an exposure step and a process step have been performed;
    transforming the measurement data time series to obtain frequency domain data; and
    determining, using the frequency domain data, a control scheme to be performed on subsequent substrates.
2. A method according to clause 1, wherein determining the control scheme comprises determining a time filter to be applied to measurements of the subsequent substrates.
3. A method according to clause 1 or 2, wherein determining the control scheme comprises determining coefficients of a time filter to be applied to measurements of the subsequent substrates.
4. A method according to clause 2, 3 or 4, wherein determining the control scheme comprises updating coefficients of a time filter in response to measurements of the subsequent substrates.
5. A method according to any one of the preceding clauses wherein, determining the control scheme comprises determining a sampling scheme to be applied to measurements of the subsequent substrates.
6. A method according to clause 6, wherein determining a sampling scheme comprises determining a spatial sampling scheme to be applied to measurements of the subsequent substrates.
7. A method according to clause 6 or 7, wherein determining a sampling scheme comprises determining a temporal sampling scheme to be applied to measurements of the subsequent substrates.
8. A method according to clause 7, further comprising determining an error offset introduced by the temporal sampling scheme on the basis of measurements of subsequent substrates and determining an improved temporal sampling scheme to compensate said error offset and to be applied in the process control scheme of a subsequent set of substrates.
9. A method according to clause 7 or 8 when dependent on clause 6, wherein determining a sampling scheme comprises determining a spatial sampling scheme and a temporal sampling scheme that are co-optimized.
10. A method according to any one of the preceding clauses, wherein determining a control scheme comprises determining a control scheme that includes first measurements at a first point in the manufacturing process and second measurements at a second point in the manufacturing process, the second point being subsequent to the first point.
11. A method according to clause 10, wherein determining a control scheme comprises determining a first sampling scheme for the first measurements and a second sampling scheme for the second measurements.
12. A method according to clause 10 or 11, wherein determining a control scheme comprises determining a first time filter to be applied to the first measurements and a second time filter to be applied to the second measurements.
13. A method according to clause 10, 11 or 12, wherein the first point is before a process step and the second point is after the process step.
14. A method according to any one of the preceding clauses, wherein the measurement data time series includes measurements of a plurality of different parameters of the substrates and determining a control scheme comprises determining a control scheme to be applied to measurements of at least two of the plurality of different parameters.
15. A method according to clause 14 wherein the process step is at least one process selected from the group of: etching, annealing, implantation, deposition, and polishing.
16. A method according to any one of the preceding clauses further comprising predicting a residual error budget after use of the control scheme.
17. A method according to any one of the preceding clauses wherein the control scheme is to be applied to correct at least one of overlay, dose and focus.
18. A computer program comprising computer readable code means for instructing a computer system to perform a method according to any one of the preceding clauses.
19. A device manufacturing process comprising:
    exposing an initial set of substrates using a lithographic apparatus;
    performing a process step on the initial set of substrates;
    measuring a parameter of a plurality of the initial set of substrates to obtain a measurement data time series;
    transforming the measurement data time series to obtain frequency domain data;
    determining, using the frequency domain data, a control scheme to be performed on subsequent substrates; and
    exposing subsequent substrates using the control scheme.
20. A method according to clause 2, wherein the time filter parameters are obtained by minimizing a cost function representing the properties of the feedback loop in which the time filters operate.
21. A method according to clause 20, wherein the cost function is based on frequency domain data representing a plurality of measurement data time series.
22. A method according to clause 21, wherein determining the control scheme comprises determining a sampling scheme for each of the plurality of measurement data time series.
23. A method according to any one of clauses 20 to 22, wherein determining the control scheme comprises determining an auto-correlation function from the frequency domain data and/or the measurement data time series.
24. A method according to any one of clauses 20 to 23, wherein determining the control scheme comprises determining a control scheme to optimize a performance metric, the performance metric optionally selected from the group consisting of total overlay and dies in spec.
25. A method according to any one of clauses 20 to 24, wherein determining the control scheme comprises determining an average error per measurement data time series and a variable error per measurement data time series.

26. A method according to any one of clauses 20 to 25, wherein the variable error is calculated based on the minimized cost function using the obtained time filter parameters.

27. A method according to any one of clauses 20 to 26, wherein transforming the measurement data time series comprises using Fourier interpolation to increase the effective sampling rate of the measurement data time series.

28. A method for generating a control scheme for a device manufacturing process, the method comprising:
obtaining a measurement data time series of a plurality of substrates on which an exposure step and a process step have been performed;
determining an auto-correlation function from the measurement data time series; and
determining, using the auto-correlation function, a control scheme to be performed on subsequent substrates.

29. A method according to clause 23 or 28, wherein determining the control scheme comprises using the auto correlation function to select a range of sampling rates for the measurement data time series.

30. A method according to clause 24, 25, 26 or 28, where determining the control scheme comprises selecting a first range of sampling rates for one or more time filters using the autocorrelation function, and a set of sampling rates from the first range of sampling rates, and corresponding time filter parameters, that minimizes the average and variable error of the plurality of measurement time series for the given performance metric.

Examples of process parameters to which the present invention can be applied include: overlay, CD, CDU, sidewall angle, line edge roughness and focus. Markers and measurement techniques suitable for measuring these parameters are well known in the art.

While specific embodiments of the invention have been described above, it will be appreciated that the invention may be practiced otherwise than as described.

An embodiment may include a computer program containing one or more sequences of machine-readable instructions configured to instruct various apparatus as depicted in FIG. 1 to perform measurement and optimization steps and to control a subsequent exposure process as described above. This computer program may be executed, for example, within the control unit LACU or the supervisory control system SCS of FIG. 1 or a combination of both. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method for generating a sampling scheme for a device manufacturing process, the method comprising:
obtaining a measurement data time series of a plurality of processed substrates;
transforming, by a hardware computer system, the measurement data time series to obtain frequency domain data;
determining, using the frequency domain data, a temporal sampling scheme;
determining an error offset introduced by the temporal sampling scheme on the basis of measurements on substrates performed according to the temporal sampling scheme; and
determining an improved temporal sampling scheme to compensate the error offset.

2. The method according to claim 1, wherein transforming the measurement data time series comprises using Fourier interpolation to increase the effective sampling rate of the measurement data time series.

3. The method according to claim 1, further comprising using an auto correlation function to select a range of sampling rates for the measurement data time series.

4. The method according to claim 1, further comprising determining a spatial sampling scheme based on the measurement data time series.

5. The method according to claim 4, wherein the spatial sampling scheme and temporal sampling scheme are co-optimized.

6. The method according to claim 1, wherein the measurement data time series includes measurements of a plurality of different parameters associated with the processed substrates and the determining the temporal sampling scheme comprises determining temporal sampling schemes to be applied to measurements of at least two of the plurality of different parameters.

7. The method according to claim 6, wherein the processed substrates are processed by at least one process selected from: etching, annealing, implantation, deposition, and/or polishing.

8. The method according to claim 1, wherein the determining the temporal sampling scheme and/or improved temporal sampling scheme comprises determining a time filter to be applied to measurement results associated with one or more subsequent substrates.

9. The method according to claim 8, wherein the determining the time filter comprises determining or updating one or more parameters of the time filter.

10. The method according to claim 9, wherein the one or more time filter parameters are obtained by minimizing a cost function representing one or more properties of a feedback loop in which the time filter operates.

11. The method according to claim 10, wherein the cost function is based on frequency domain data representing a plurality of measurement data time series.

12. The method of claim 1, further comprising using the improved temporal sampling scheme in a process control scheme for one or more subsequent substrates.

13. The method according to claim 12, wherein the process control scheme is to be applied to correct at least one selected from: overlay, dose and/or focus.

14. The method according to claim 12, wherein the process control scheme is at least partially based on an auto-correlation function from the frequency domain data and/or the measurement data time series.

15. The method according to claim 12, wherein the process control scheme is at least partially based on an average error per measurement data time series and a variable error per measurement data time series.

16. The method according to claim 12, wherein the process control scheme comprises determining a control scheme that includes first measurements at a first point in the manufacturing process and second measurements at a second point in the manufacturing process, the second point being subsequent to the first point.

17. The method according to claim 12, further comprising predicting a residual error budget after use of the process control scheme.

18. The method according to claim 12, wherein the process control scheme is at least partially based on an auto-correlation function from the frequency domain data and/or the measurement data time series, and further comprising selecting a first range of sampling rates for one or more time filters using the autocorrelation function, and selecting a set of sampling rates from the first range of sampling rates, and one or more corresponding time filter parameters, that minimizes average and variable error of a plurality of measurement time series for a given performance metric.

19. A computer program product comprising a non-transitory computer-readable medium having instructions therein, the instructions, when executed by a computer system, configured to cause the computer system to at least:
obtain a measurement data time series of a plurality of processed substrates;
transform the measurement data time series to obtain frequency domain data;
determine, using the frequency domain data, a temporal sampling scheme;
determine an error offset introduced by the temporal sampling scheme on the basis of measurements on substrates performed according to the temporal sampling scheme; and
determine an improved temporal sampling scheme to compensate the error offset.

20. The computer program product of claim 19, wherein the instructions are further configured to cause the computer system to use the improved temporal sampling scheme in a process control scheme for one or more subsequent substrates.

* * * * *